United States Patent
Hayden et al.

(10) Patent No.: US 7,417,446 B2
(45) Date of Patent: Aug. 26, 2008

(54) PROBE FOR COMBINED SIGNALS

(75) Inventors: Leonard Hayden, Portland, OR (US);
Scott Rumbaugh, Tigard, OR (US);
Mike Andrews, Hillsboro, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/975,937

(22) Filed: Oct. 22, 2007

(65) Prior Publication Data

US 2008/0042673 A1 Feb. 21, 2008

Related U.S. Application Data

(60) Continuation of application No. 11/901,626, filed on Sep. 18, 2007, which is a continuation of application No. 11/714,003, filed on Mar. 5, 2007, now Pat. No. 7,285,969, which is a continuation of application No. 11/442,503, filed on May 25, 2006, now Pat. No. 7,205,784, which is a continuation of application No. 11/077,810, filed on Mar. 9, 2005, now Pat. No. 7,075,320, which is a continuation of application No. 10/928,688, filed on Aug. 26, 2004, now Pat. No. 7,046,023, which is a continuation of application No. 10/712,579, filed on Nov. 12, 2003, now Pat. No. 6,806,724, which is a division of application No. 10/294,130, filed on Nov. 13, 2002, now Pat. No. 6,724,205.

(51) Int. Cl.
*G01R 31/02* (2006.01)

(52) U.S. Cl. ...................................... 324/754

(58) Field of Classification Search ........................ None
See application file for complete search history.

(56) References Cited

U.S. PATENT DOCUMENTS

| 491,783 | A | 2/1893 | Moyer |
| 1,337,866 | A | 4/1920 | Whitacker |
| 2,142,625 | A | 1/1939 | Zoethout |
| 2,376,101 | A | 5/1945 | Tyzzer |
| 2,389,668 | A | 11/1945 | Johnson |
| 2,545,258 | A | 3/1951 | Cailloux |

(Continued)

FOREIGN PATENT DOCUMENTS

CH    607 045    11/1978

(Continued)

OTHER PUBLICATIONS

Cohn, S, "Properties of Ridge Wave Guide," Proceedings of the I.R.E., Aug. 1947, pp. 783-788.

(Continued)

*Primary Examiner*—Ha Nguyen
*Assistant Examiner*—Trung Q. Nguyen
(74) *Attorney, Agent, or Firm*—Chernoff, Vilhauer, McClung & Stenzel

(57) ABSTRACT

A direct current and a modulation signal are simultaneously applied to contact pads on a device under test, such as a laser diode, with a probe that reduces signal distortion and power dissipation by transmitting a modulated signal through an impedance matching resistor and transmitting of a direct current over a second signal path that avoids the impedance matching resistor.

6 Claims, 5 Drawing Sheets

U.S. PATENT DOCUMENTS

| | | |
|---|---|---|
| 2,762,234 A | 9/1956 | Dodd |
| 2,901,696 A | 8/1959 | Möllfors |
| 2,921,276 A | 1/1960 | Fubini |
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,487,996 A | 12/1984 | Rabinowitz et al. |
| 4,515,133 A | 5/1985 | Roman |
| 4,515,439 A | 5/1985 | Esswein |
| 4,528,504 A | 7/1985 | Thornton, Jr. et al. |
| 4,552,033 A | 11/1985 | Marzhauser |
| 4,567,321 A | 1/1986 | Harayama |
| 4,588,950 A | 5/1986 | Henley |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,713,347 A | 12/1987 | Mitchell et al. |
| 4,714,873 A | 12/1987 | McPherson et al. |
| 4,725,793 A | 2/1988 | Igarashi |
| 4,727,319 A | 2/1988 | Shahriary |
| 4,727,391 A | 2/1988 | Tajima et al. |
| 4,727,637 A | 3/1988 | Buckwitz et al. |
| 4,734,641 A | 3/1988 | Byrd, Jr. et al. |
| 4,739,259 A | 4/1988 | Hadwin et al. |
| 4,740,764 A | 4/1988 | Gerlack |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,742 A | 7/1988 | Mallory et al. |
| 4,755,747 A | 7/1988 | Sato |
| 4,755,872 A | 7/1988 | Esrig et al. |

| | | | | | | |
|---|---|---|---|---|---|---|
| 4,755,874 A | 7/1988 | Esrig et al. | | 5,082,627 A | 1/1992 | Stanbro |
| 4,757,255 A | 7/1988 | Margozzi | | 5,084,671 A | 1/1992 | Miyata et al. |
| 4,764,723 A | 8/1988 | Strid | | 5,089,774 A | 2/1992 | Nakano |
| 4,766,384 A | 8/1988 | Kleinberg et al. | | 5,091,692 A | 2/1992 | Ohno et al. |
| 4,722,846 A | 9/1988 | Reeds | | 5,091,732 A | 2/1992 | Mileski et al. |
| 4,772,846 A | 9/1988 | Reeds | | 5,095,891 A | 3/1992 | Reitter |
| 4,780,670 A | 10/1988 | Cherry | | 5,097,101 A | 3/1992 | Trobough |
| 4,783,625 A | 11/1988 | Harry et al. | | 5,097,207 A | 3/1992 | Blanz |
| 4,788,851 A | 12/1988 | Brault | | 5,101,453 A | 3/1992 | Rumbaugh |
| 4,791,363 A | 12/1988 | Logan | | 5,107,076 A | 4/1992 | Bullock et al. |
| 4,793,814 A | 12/1988 | Zifcak et al. | | 5,116,180 A | 5/1992 | Fung et al. |
| 4,795,962 A | 1/1989 | Yanagawa et al. | | 5,126,286 A | 6/1992 | Chance |
| 4,805,627 A | 2/1989 | Klingenbeck et al. | | 5,126,696 A | 6/1992 | Grote et al. |
| 4,810,981 A | 3/1989 | Herstein | | 5,133,119 A | 7/1992 | Afshari et al. |
| 4,812,754 A | 3/1989 | Tracy et al. | | 5,134,365 A | 7/1992 | Okubo et al. |
| 4,818,059 A | 4/1989 | Kakii et al. | | 5,136,237 A | 8/1992 | Smith et al. |
| 4,827,211 A | 5/1989 | Strid et al. | | 5,138,289 A | 8/1992 | McGrath |
| 4,831,494 A | 5/1989 | Arnold et al. | | 5,142,224 A | 8/1992 | Smith et al. |
| 4,835,495 A | 5/1989 | Simonutti | | 5,145,552 A | 9/1992 | Yoshizawa et al. |
| 4,837,507 A | 6/1989 | Hechtman | | 5,148,131 A | 9/1992 | Amboss et al. |
| 4,839,587 A | 6/1989 | Flatley et al. | | 5,159,264 A | 10/1992 | Anderson |
| 4,849,689 A | 7/1989 | Gleason et al. | | 5,159,267 A | 10/1992 | Anderson |
| 4,853,624 A | 8/1989 | Rabjohn | | 5,159,752 A | 11/1992 | Mahant-Shetti et al. |
| 4,853,627 A | 8/1989 | Gleason et al. | | 5,160,883 A | 11/1992 | Blanz |
| 4,858,160 A | 8/1989 | Strid et al. | | 5,164,319 A | 11/1992 | Hafeman et al. |
| 4,859,989 A | 8/1989 | McPherson | | 5,166,606 A | 11/1992 | Blanz |
| 4,864,227 A | 9/1989 | Sato | | 5,172,049 A | 12/1992 | Kiyokawa et al. |
| 4,871,883 A | 10/1989 | Guiol | | 5,172,050 A | 12/1992 | Swapp |
| 4,871,964 A | 10/1989 | Boll et al. | | 5,172,051 A | 12/1992 | Zamborelli |
| 4,888,550 A | 12/1989 | Reid | | 5,177,438 A | 1/1993 | Littlebury et al. |
| 4,891,584 A | 1/1990 | Kamieniecki et al. | | 5,180,977 A | 1/1993 | Huff |
| 4,893,914 A | 1/1990 | Hancock et al. | | 5,187,443 A | 2/1993 | Bereskin |
| 4,894,612 A | 1/1990 | Drake et al. | | 5,198,752 A | 3/1993 | Miyata et al. |
| 4,899,126 A | 2/1990 | Yamada | | 5,198,753 A | 3/1993 | Hamburgen |
| 4,899,998 A | 2/1990 | Feramachi | | 5,202,558 A | 4/1993 | Barker |
| 4,901,012 A | 2/1990 | Gloanec et al. | | 5,202,648 A | 4/1993 | McCandless |
| 4,904,933 A | 2/1990 | Snyder et al. | | 5,207,585 A | 5/1993 | Byrnes et al. |
| 4,904,935 A | 2/1990 | Calma et al. | | 5,214,243 A | 5/1993 | Johnson |
| 4,906,920 A | 3/1990 | Huff et al. | | 5,214,374 A | 5/1993 | St. Onge |
| 4,908,570 A | 3/1990 | Gupta et al. | | 5,225,037 A | 7/1993 | Elder et al. |
| 4,912,399 A | 3/1990 | Greub et al. | | 5,227,730 A | 7/1993 | King et al. |
| 4,916,002 A | 4/1990 | Carver | | 5,232,789 A | 8/1993 | Platz et al. |
| 4,916,398 A | 4/1990 | Rath | | 5,233,197 A | 8/1993 | Bowman et al. |
| 4,918,373 A | 4/1990 | Newberg | | 5,233,306 A | 8/1993 | Misra |
| 4,918,383 A | 4/1990 | Huff et al. | | 5,245,292 A | 9/1993 | Milesky et al. |
| 4,922,128 A | 5/1990 | Dhong et al. | | 5,266,889 A | 11/1993 | Harwood et al. |
| 4,922,186 A | 5/1990 | Tsuchiya et al. | | 5,266,963 A | 11/1993 | Carter |
| 4,922,912 A | 5/1990 | Watanabe | | 5,267,088 A | 11/1993 | Nomura |
| 4,926,172 A | 5/1990 | Gorsek | | 5,270,664 A | 12/1993 | McMurty et al. |
| 4,929,893 A | 5/1990 | Sato et al. | | 5,274,336 A | 12/1993 | Crook et al. |
| 4,970,386 A | 11/1990 | Buck | | 5,280,156 A | 1/1994 | Niori et al. |
| 4,972,073 A | 11/1990 | Lessing | | 5,289,117 A | 2/1994 | Van Loan et al. |
| 4,975,638 A | 12/1990 | Evans et al. | | 5,293,175 A | 3/1994 | Hemmie et al. |
| 4,980,637 A | 12/1990 | Huff et al. | | 5,298,972 A | 3/1994 | Heffner |
| 4,983,910 A | 1/1991 | Majidi-Ahy et al. | | 5,304,924 A | 4/1994 | Yamano et al. |
| 4,987,100 A | 1/1991 | McBride et al. | | 5,313,157 A | 5/1994 | Pasiecznik, Jr. |
| 4,988,062 A | 1/1991 | London | | 5,315,237 A | 5/1994 | Iwakura et al. |
| 4,991,290 A | 2/1991 | MacKay | | 5,316,435 A | 5/1994 | Mozingo |
| 4,998,062 A | 3/1991 | Ikeda | | 5,317,656 A | 5/1994 | Moslehi et al. |
| 4,998,063 A | 3/1991 | Miller | | 5,321,352 A | 6/1994 | Takebuchi |
| 5,001,423 A | 3/1991 | Abrami et al. | | 5,321,453 A | 6/1994 | Mori et al. |
| 5,003,253 A | 3/1991 | Majidi-Ahy et al. | | 5,326,412 A | 7/1994 | Schreiber et al. |
| 5,012,186 A | 4/1991 | Gleason | | 5,334,931 A | 8/1994 | Clarke et al. |
| 5,020,219 A | 6/1991 | Leedy | | 5,347,204 A | 9/1994 | Gregory et al. |
| 5,021,186 A | 6/1991 | Ota et al. | | 5,355,079 A | 10/1994 | Evans et al. |
| 5,030,907 A | 7/1991 | Yih et al. | | 5,357,211 A | 10/1994 | Bryson et al. |
| 5,041,782 A | 8/1991 | Marzan | | 5,360,312 A | 11/1994 | Mozingo |
| 5,045,781 A | 9/1991 | Gleason et al. | | 5,361,049 A | 11/1994 | Rubin et al. |
| 5,059,898 A | 10/1991 | Barsotti et al. | | 5,363,050 A | 11/1994 | Guo et al. |
| 5,061,192 A | 10/1991 | Chapin et al. | | 5,367,165 A | 11/1994 | Toda et al. |
| 5,061,823 A | 10/1991 | Carroll | | 5,369,368 A | 11/1994 | Kassen et al. |
| 5,066,357 A | 11/1991 | Smyth, Jr. et al. | | 5,371,654 A | 12/1994 | Beaman et al. |
| 5,069,628 A | 12/1991 | Crumly | | 5,373,231 A | 12/1994 | Boll et al. |

| | | |
|---|---|---|
| 5,374,938 A | 12/1994 | Hatazawa et al. |
| 5,376,790 A | 12/1994 | Linker et al. |
| 5,383,787 A | 1/1995 | Switky et al. |
| 5,389,885 A | 2/1995 | Swart |
| 5,395,253 A | 3/1995 | Crumly |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,430,813 A | 7/1995 | Anderson et al. |
| 5,441,690 A | 8/1995 | Ayala-Esquilin et al. |
| 5,451,884 A | 9/1995 | Sauerland |
| 5,453,404 A | 9/1995 | Leedy |
| 5,457,398 A | 10/1995 | Schwindt et al. |
| 5,463,324 A | 10/1995 | Wardwell et al. |
| 5,467,024 A | 11/1995 | Swapp |
| 5,469,324 A | 11/1995 | Henderson et al. |
| 5,475,316 A | 12/1995 | Hurley et al. |
| 5,476,211 A | 12/1995 | Khandros |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,487,999 A | 1/1996 | Farnworth |
| 5,488,954 A | 2/1996 | Sleva et al. |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,507,652 A | 4/1996 | Wardwell |
| 5,510,792 A | 4/1996 | Ono et al. |
| 5,511,010 A | 4/1996 | Burns |
| 5,512,835 A | 4/1996 | Rivera et al. |
| 5,517,126 A | 5/1996 | Yamaguchi |
| 5,521,518 A | 5/1996 | Higgins |
| 5,521,522 A | 5/1996 | Abe et al. |
| 5,523,694 A | 6/1996 | Cole, Jr. |
| 5,528,158 A | 6/1996 | Sinsheimer et al. |
| 5,530,372 A | 6/1996 | Lee et al. |
| 5,531,022 A | 7/1996 | Beaman et al. |
| 5,532,608 A | 7/1996 | Behfar-Rad et al. |
| 5,537,372 A | 7/1996 | Albrecht et al. |
| 5,539,323 A | 7/1996 | Davis, Jr. |
| 5,539,676 A | 7/1996 | Yamaguchi |
| 5,550,481 A | 8/1996 | Holmes et al. |
| 5,561,378 A | 10/1996 | Bockelman et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,578,932 A | 11/1996 | Adamian |
| 5,583,445 A | 12/1996 | Mullen |
| 5,584,120 A | 12/1996 | Roberts |
| 5,584,608 A | 12/1996 | Gillespie |
| 5,589,781 A | 12/1996 | Higgens et al. |
| 5,594,358 A | 1/1997 | Ishikawa et al. |
| 5,600,256 A | 2/1997 | Woith et al. |
| 5,601,740 A | 2/1997 | Eldridge et al. |
| 5,610,529 A | 3/1997 | Schwindt |
| 5,611,008 A | 3/1997 | Yap |
| 5,617,035 A | 4/1997 | Swapp |
| 5,621,333 A | 4/1997 | Long et al. |
| 5,621,400 A | 4/1997 | Corbi |
| 5,623,213 A | 4/1997 | Liu et al. |
| 5,623,214 A | 4/1997 | Pasiecznik, Jr. |
| 5,627,473 A | 5/1997 | Takami |
| 5,628,057 A | 5/1997 | Phillips et al. |
| 5,629,838 A | 5/1997 | Knight et al. |
| 5,631,571 A | 5/1997 | Spaziani et al. |
| 5,633,780 A | 5/1997 | Cronin |
| 5,635,846 A | 6/1997 | Beaman et al. |
| 5,642,298 A | 6/1997 | Mallory et al. |
| 5,644,248 A | 7/1997 | Fujimoto |
| 5,653,939 A | 8/1997 | Hollis et al. |
| 5,656,942 A | 8/1997 | Watts et al. |
| 5,659,421 A | 8/1997 | Rahmel et al. |
| 5,666,063 A | 9/1997 | Abercrombie et al. |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,678,210 A | 10/1997 | Hannah |
| 5,685,232 A | 11/1997 | Inoue |
| 5,686,317 A | 11/1997 | Akram et al. |
| 5,686,960 A | 11/1997 | Sussman et al. |
| 5,688,618 A | 11/1997 | Hulderman et al. |
| 5,700,844 A | 12/1997 | Hederick et al. |
| 5,704,355 A | 1/1998 | Bridges |
| 5,715,819 A | 2/1998 | Svenson et al. |
| 5,720,098 A | 2/1998 | Kister |
| 5,723,347 A | 3/1998 | Kirano et al. |
| 5,726,211 A | 3/1998 | Hedrick et al. |
| 5,728,091 A | 3/1998 | Payne et al. |
| 5,729,150 A | 3/1998 | Schwindt |
| 5,731,920 A | 3/1998 | Katsuragawa |
| 5,742,174 A | 4/1998 | Kister et al. |
| 5,744,971 A | 4/1998 | Chan et al. |
| 5,748,506 A | 5/1998 | Bockelman |
| 5,751,153 A | 5/1998 | Bockelman |
| 5,751,252 A | 5/1998 | Phillips |
| 5,756,021 A | 5/1998 | Bedrick et al. |
| 5,756,908 A | 5/1998 | Knollmeyer et al. |
| 5,764,070 A | 6/1998 | Pedder |
| 5,767,690 A | 6/1998 | Fujimoto |
| 5,772,451 A | 6/1998 | Dozier, II et al. |
| 5,773,780 A | 6/1998 | Eldridge et al. |
| 5,777,485 A | 7/1998 | Tanaka et al. |
| 5,785,538 A | 7/1998 | Beaman et al. |
| 5,792,668 A | 8/1998 | Fuller et al. |
| 5,793,213 A | 8/1998 | Bockelman et al. |
| 5,794,133 A | 8/1998 | Kashima |
| 5,803,607 A | 9/1998 | Jones et al. |
| 5,804,607 A | 9/1998 | Hedrick et al. |
| 5,804,982 A | 9/1998 | Lo et al. |
| 5,804,983 A | 9/1998 | Nakajima et al. |
| 5,806,181 A | 9/1998 | Khandros et al. |
| 5,807,107 A | 9/1998 | Bright et al. |
| 5,810,607 A | 9/1998 | Shih et al. |
| 5,811,751 A | 9/1998 | Leona et al. |
| 5,811,982 A | 9/1998 | Beaman et al. |
| 5,813,847 A | 9/1998 | Eroglu et al. |
| 5,814,847 A | 9/1998 | Shihadeh et al. |
| 5,820,014 A | 10/1998 | Dozier, II et al. |
| 5,821,763 A | 10/1998 | Beaman et al. |
| 5,824,494 A | 10/1998 | Feldberg |
| 5,829,128 A | 11/1998 | Eldridge et al. |
| 5,829,437 A | 11/1998 | Bridges |
| 5,831,442 A | 11/1998 | Heigl |
| 5,832,601 A | 11/1998 | Eldridge et al. |
| 5,833,601 A | 11/1998 | Swartz et al. |
| 5,838,160 A | 11/1998 | Beaman et al. |
| 5,841,288 A | 11/1998 | Meaney et al. |
| 5,841,342 A | 11/1998 | Hegmann et al. |
| 5,846,708 A | 12/1998 | Hollis et al. |
| 5,847,569 A | 12/1998 | Ho et al. |

| Patent No. | Date | Name |
|---|---|---|
| 5,848,500 A | 12/1998 | Kirk |
| 5,852,232 A | 12/1998 | Samsavar et al. |
| 5,852,871 A | 12/1998 | Khandros |
| 5,854,608 A | 12/1998 | Leisten |
| 5,864,946 A | 2/1999 | Eldridge et al. |
| 5,867,073 A | 2/1999 | Weinreb et al. |
| 5,869,326 A | 2/1999 | Hofmann |
| 5,869,974 A | 2/1999 | Akram et al. |
| 5,874,361 A | 2/1999 | Collins et al. |
| 5,876,082 A | 3/1999 | Kempf et al. |
| 5,878,486 A | 3/1999 | Eldridge et al. |
| 5,879,289 A | 3/1999 | Yarush et al. |
| 5,883,522 A | 3/1999 | O'Boyle |
| 5,883,523 A | 3/1999 | Ferland et al. |
| 5,884,398 A | 3/1999 | Eldridge et al. |
| 5,888,075 A | 3/1999 | Hasegawa et al. |
| 5,892,539 A | 4/1999 | Colvin |
| 5,896,038 A | 4/1999 | Budnaitis et al. |
| 5,900,737 A | 5/1999 | Graham et al. |
| 5,900,738 A | 5/1999 | Khandros et al. |
| 5,903,143 A | 5/1999 | Mochizuki et al. |
| 5,905,421 A | 5/1999 | Oldfield |
| 5,910,727 A | 6/1999 | Fujihara et al. |
| 5,912,046 A | 6/1999 | Eldridge et al. |
| 5,914,613 A | 6/1999 | Gleason et al. |
| 5,914,614 A | 6/1999 | Beaman et al. |
| 5,916,689 A | 6/1999 | Collins et al. |
| 5,917,707 A | 6/1999 | Khandros et al. |
| 5,923,180 A | 7/1999 | Botka et al. |
| 5,926,029 A | 7/1999 | Ference et al. |
| 5,926,951 A | 7/1999 | Khandros et al. |
| 5,940,965 A | 8/1999 | Uhling et al. |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |
| 5,959,461 A | 9/1999 | Brown et al. |
| 5,963,364 A | 10/1999 | Leong et al. |
| 5,966,645 A | 10/1999 | Davis |
| 5,970,429 A | 10/1999 | Martin |
| 5,973,504 A | 10/1999 | Chong |
| 5,974,662 A | 11/1999 | Eldridge et al. |
| 5,977,783 A | 11/1999 | Takayama et al. |
| 5,981,268 A | 11/1999 | Kovacs et al. |
| 5,982,166 A | 11/1999 | Mautz |
| 5,983,493 A | 11/1999 | Eldridge et al. |
| 5,993,611 A | 11/1999 | Moroney, III et al. |
| 5,994,152 A | 11/1999 | Khandros et al. |
| 5,995,914 A | 11/1999 | Cabot |
| 5,996,102 A | 11/1999 | Haulin |
| 5,998,228 A | 12/1999 | Eldridge et al. |
| 5,998,768 A | 12/1999 | Hunter et al. |
| 5,998,864 A | 12/1999 | Khandros et al. |
| 5,999,268 A | 12/1999 | Yonezawa et al. |
| 6,001,760 A | 12/1999 | Katsuda et al. |
| 6,002,426 A | 12/1999 | Back et al. |
| 6,006,002 A | 12/1999 | Motok et al. |
| 6,013,586 A | 1/2000 | McGhee et al. |
| 6,019,612 A | 2/2000 | Hasegawa et al. |
| 6,023,103 A | 2/2000 | Chang et al. |
| 6,028,435 A | 2/2000 | Nikawa |
| 6,029,344 A | 2/2000 | Khandros et al. |
| 6,031,383 A | 2/2000 | Streib et al. |
| 6,032,356 A | 3/2000 | Eldridge et al. |
| 6,032,714 A | 3/2000 | Fenton |
| 6,033,935 A | 3/2000 | Dozier, II et al. |
| 6,034,533 A | 3/2000 | Tervo et al. |
| 6,037,785 A | 3/2000 | Higgins |
| 6,040,739 A | 3/2000 | Wedeen et al. |
| 6,042,712 A | 3/2000 | Mathieu |
| 6,043,563 A | 3/2000 | Eldridge et al. |
| 6,046,599 A | 4/2000 | Long et al. |
| 6,049,216 A | 4/2000 | Yang et al. |
| 6,049,976 A | 4/2000 | Khandros |
| 6,050,829 A | 4/2000 | Eldridge et al. |
| 6,051,422 A | 4/2000 | Kovacs et al. |
| 6,052,653 A | 4/2000 | Mazur et al. |
| 6,054,651 A | 4/2000 | Fogel et al. |
| 6,054,869 A | 4/2000 | Hutton et al. |
| 6,059,982 A | 5/2000 | Palagonia et al. |
| 6,060,888 A | 5/2000 | Blackham et al. |
| 6,060,892 A | 5/2000 | Yamagata |
| 6,061,589 A | 5/2000 | Bridges et al. |
| 6,062,879 A | 5/2000 | Beaman et al. |
| 6,064,213 A | 5/2000 | Khandros et al. |
| 6,064,217 A | 5/2000 | Smith |
| 6,064,218 A | 5/2000 | Godfrey et al. |
| 6,066,911 A | 5/2000 | Lindemann et al. |
| 6,071,009 A | 6/2000 | Clyne |
| 6,078,183 A | 6/2000 | Cole, Jr. |
| 6,078,500 A | 6/2000 | Beaman et al. |
| 6,090,261 A | 7/2000 | Mathieu |
| 6,091,236 A | 7/2000 | Piety et al. |
| 6,091,255 A | 7/2000 | Godfrey |
| 6,091,256 A | 7/2000 | Long et al. |
| 6,096,561 A | 8/2000 | Kaplan et al. |
| 6,096,567 A | 8/2000 | Kaplan et al. |
| 6,100,815 A | 8/2000 | Pailthorp |
| 6,104,201 A | 8/2000 | Beaman et al. |
| 6,104,206 A | 8/2000 | Verkull |
| 6,110,823 A | 8/2000 | Eldridge et al. |
| 6,114,864 A | 9/2000 | Soejima et al. |
| 6,114,865 A | 9/2000 | Lagowski et al. |
| 6,118,287 A | 9/2000 | Boll et al. |
| 6,118,894 A | 9/2000 | Schwartz et al. |
| 6,121,836 A | 9/2000 | Vallencourt |
| 6,124,725 A | 9/2000 | Sato |
| 6,127,831 A | 10/2000 | Khoury et al. |
| 6,130,536 A | 10/2000 | Powell et al. |
| 6,137,302 A | 10/2000 | Schwindt |
| 6,144,212 A | 11/2000 | Mizuta |
| 6,147,502 A | 11/2000 | Fryer et al. |
| 6,147,851 A | 11/2000 | Anderson |
| 6,150,186 A | 11/2000 | Chen et al. |
| 6,160,407 A | 12/2000 | Nikawa |
| 6,166,553 A | 12/2000 | Sinsheimer |
| 6,168,974 B1 | 1/2001 | Chang et al. |
| 6,169,410 B1 | 1/2001 | Grace et al. |
| 6,172,337 B1 | 1/2001 | Johnsgard et al. |
| 6,174,744 B1 | 1/2001 | Watanabe et al. |
| 6,175,228 B1 | 1/2001 | Zamborelli et al. |
| 6,176,091 B1 | 1/2001 | Kishi et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,206,273 B1 | 3/2001 | Beaman et al. |
| 6,208,225 B1 | 3/2001 | Miller |
| RE37,130 E | 4/2001 | Fiori, Jr. |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |

| Patent | Kind | Date | Inventor |
|---|---|---|---|
| 6,232,789 | B1 | 5/2001 | Schwindt |
| 6,233,613 | B1 | 5/2001 | Walker et al. |
| 6,236,223 | B1 | 5/2001 | Brady et al. |
| 6,242,803 | B1 | 6/2001 | Khandros et al. |
| 6,242,929 | B1 | 6/2001 | Mizuta |
| 6,245,692 | B1 | 6/2001 | Pearce et al. |
| 6,246,247 | B1 | 6/2001 | Eldridge et al. |
| 6,251,595 | B1 | 6/2001 | Gordon et al. |
| 6,255,126 | B1 | 7/2001 | Mathieu et al. |
| 6,256,882 | B1 | 7/2001 | Gleason et al. |
| 6,257,564 | B1 | 7/2001 | Avneri et al. |
| 6,257,565 | B1 | 7/2001 | Avneri et al. |
| 6,265,950 | B1 | 7/2001 | Schmidt et al. |
| 6,268,015 | B1 | 7/2001 | Mathieu et al. |
| 6,268,016 | B1 | 7/2001 | Bhatt et al. |
| 6,271,673 | B1 | 8/2001 | Furuta et al. |
| 6,274,823 | B1 | 8/2001 | Khandros et al. |
| 6,275,043 | B1 | 8/2001 | Mühlberger et al. |
| 6,275,738 | B1 | 8/2001 | Kasevich et al. |
| 6,278,051 | B1 | 8/2001 | Peabody |
| 6,278,411 | B1 | 8/2001 | Ohlsson et al. |
| 6,281,691 | B1 | 8/2001 | Matsunaga et al. |
| 6,286,208 | B1 | 9/2001 | Shih et al. |
| 6,292,760 | B1 | 9/2001 | Burns |
| 6,295,729 | B1 | 10/2001 | Beaman et al. |
| 6,300,775 | B1 | 10/2001 | Peach et al. |
| 6,300,780 | B1 | 10/2001 | Beaman et al. |
| 6,307,161 | B1 | 10/2001 | Grube et al. |
| 6,307,363 | B1 | 10/2001 | Anderson |
| 6,307,672 | B1 | 10/2001 | DeNure |
| 6,310,483 | B1 | 10/2001 | Taura et al. |
| 6,320,372 | B1 | 11/2001 | Keller |
| 6,320,396 | B1 | 11/2001 | Nikawa |
| 6,327,034 | B1 | 12/2001 | Hoover et al. |
| 6,329,827 | B1 | 12/2001 | Beaman et al. |
| 6,330,164 | B1 | 12/2001 | Khandros et al. |
| 6,332,270 | B2 | 12/2001 | Beaman et al. |
| 6,334,247 | B1 | 1/2002 | Beaman et al. |
| 6,335,625 | B1 | 1/2002 | Bryant et al. |
| 6,339,338 | B1 | 1/2002 | Eldridge et al. |
| 6,340,568 | B2 | 1/2002 | Hefti |
| 6,340,895 | B1 | 1/2002 | Uher et al. |
| 6,351,885 | B2 | 3/2002 | Suzuki et al. |
| 6,352,454 | B1 | 3/2002 | Kim et al. |
| 6,359,456 | B1 | 3/2002 | Hembree et al. |
| 6,362,792 | B1 | 3/2002 | Sawamura et al. |
| 6,366,247 | B1 | 4/2002 | Sawamura et al. |
| 6,369,776 | B1 | 4/2002 | Leisten et al. |
| 6,376,258 | B2 | 4/2002 | Hefti |
| 6,384,614 | B1 | 5/2002 | Hager et al. |
| 6,384,615 | B2 | 5/2002 | Schwindt |
| 6,388,455 | B1 | 5/2002 | Kamieniecki et al. |
| 6,395,480 | B1 | 5/2002 | Hefti |
| 6,396,296 | B1 | 5/2002 | Tarter et al. |
| 6,396,298 | B1 | 5/2002 | Young et al. |
| 6,400,168 | B2 | 6/2002 | Matsunaga et al. |
| 6,404,213 | B2 | 6/2002 | Noda |
| 6,407,542 | B1 | 6/2002 | Conte |
| 6,407,562 | B1 | 6/2002 | Whiteman |
| 6,409,724 | B1 | 6/2002 | Penny et al. |
| 6,414,478 | B1 | 7/2002 | Suzuki |
| 6,415,858 | B1 | 7/2002 | Getchel et al. |
| 6,418,009 | B1 | 7/2002 | Brunette |
| 6,420,722 | B2 | 7/2002 | Moore et al. |
| 6,424,316 | B1 | 7/2002 | Leisten et al. |
| 6,429,029 | B1 | 8/2002 | Eldridge et al. |
| 6,441,315 | B1 | 8/2002 | Eldridge et al. |
| 6,442,831 | B1 | 9/2002 | Khandros et al. |
| 6,447,339 | B1 | 9/2002 | Reed et al. |
| 6,448,788 | B1 | 9/2002 | Meaney et al. |
| 6,448,865 | B1 | 9/2002 | Miller |
| 6,452,406 | B1 | 9/2002 | Beaman et al. |
| 6,452,411 | B1 | 9/2002 | Miller et al. |
| 6,456,099 | B1 | 9/2002 | Eldridge et al. |
| 6,456,103 | B1 | 9/2002 | Eldridge et al. |
| 6,459,343 | B1 | 10/2002 | Miller |
| 6,459,739 | B1 | 10/2002 | Vitenberg |
| 6,468,098 | B1 | 10/2002 | Eldridge |
| 6,475,822 | B2 | 11/2002 | Eldridge |
| 6,476,333 | B1 | 11/2002 | Khandros et al. |
| 6,476,442 | B1 | 11/2002 | Williams et al. |
| 6,476,630 | B1 | 11/2002 | Whitten et al. |
| 6,479,308 | B1 | 11/2002 | Eldridge |
| 6,480,013 | B1 | 11/2002 | Nayler et al. |
| 6,480,978 | B1 | 11/2002 | Roy et al. |
| 6,481,939 | B1 | 11/2002 | Gillespie et al. |
| 6,482,013 | B2 | 11/2002 | Eldridge et al. |
| 6,483,327 | B1 | 11/2002 | Bruce et al. |
| 6,488,405 | B1 | 12/2002 | Eppes et al. |
| 6,490,471 | B2 | 12/2002 | Svenson et al. |
| 6,491,968 | B1 | 12/2002 | Mathieu et al. |
| 6,496,024 | B2 | 12/2002 | Schwindt |
| 6,499,121 | B1 | 12/2002 | Roy et al. |
| 6,501,343 | B2 | 12/2002 | Miller |
| 6,509,751 | B1 | 1/2003 | Mathieu et al. |
| 6,512,482 | B1 | 1/2003 | Nelson et al. |
| 6,520,778 | B1 | 2/2003 | Eldridge et al. |
| 6,525,555 | B1 | 2/2003 | Khandros et al. |
| 6,526,655 | B2 | 3/2003 | Beaman et al. |
| 6,528,984 | B2 | 3/2003 | Beaman et al. |
| 6,528,993 | B1 | 3/2003 | Shin et al. |
| 6,529,844 | B1 | 3/2003 | Kapetanic et al. |
| 6,534,856 | B1 | 3/2003 | Dozier, II et al. |
| 6,538,214 | B2 | 3/2003 | Khandros |
| 6,538,538 | B2 | 3/2003 | Hreish et al. |
| 6,539,531 | B2 | 3/2003 | Miller et al. |
| 6,548,311 | B1 | 4/2003 | Knoll |
| 6,549,022 | B1 | 4/2003 | Cole, Jr. et al. |
| 6,549,106 | B2 | 4/2003 | Martin |
| 6,551,884 | B2 | 4/2003 | Masuoka |
| 6,559,671 | B2 | 5/2003 | Miller et al. |
| 6,566,079 | B2 | 5/2003 | Hefti |
| 6,572,608 | B1 | 6/2003 | Lee et al. |
| 6,573,702 | B2 | 6/2003 | Marcuse et al. |
| 6,578,264 | B1 | 6/2003 | Gleason et al. |
| 6,580,283 | B1 | 6/2003 | Carbone et al. |
| 6,582,979 | B2 | 6/2003 | Coccioli et al. |
| 6,587,327 | B1 | 7/2003 | Devoe et al. |
| 6,597,187 | B2 | 7/2003 | Eldridge et al. |
| 6,603,322 | B1 | 8/2003 | Boll et al. |
| 6,603,323 | B1 | 8/2003 | Miller et al. |
| 6,603,324 | B2 | 8/2003 | Eldridge et al. |
| 6,605,941 | B2 | 8/2003 | Abe |
| 6,605,951 | B1 | 8/2003 | Cowan |
| 6,605,955 | B1 | 8/2003 | Costello et al. |
| 6,606,014 | B2 | 8/2003 | Miller |
| 6,606,575 | B2 | 8/2003 | Miller |
| 6,608,494 | B1 | 8/2003 | Bruce et al. |
| 6,611,417 | B2 | 8/2003 | Chen |
| 6,615,485 | B2 | 9/2003 | Eldridge et al. |
| 6,616,966 | B2 | 9/2003 | Mathieu et al. |
| 6,617,862 | B1 | 9/2003 | Bruce |
| 6,617,866 | B1 | 9/2003 | Ickes |
| 6,621,082 | B2 | 9/2003 | Morita et al. |
| 6,621,260 | B2 | 9/2003 | Eldridge et al. |
| 6,622,103 | B1 | 9/2003 | Miller |
| 6,624,648 | B2 | 9/2003 | Eldridge et al. |
| 6,627,461 | B2 | 9/2003 | Chapman et al. |
| 6,627,483 | B2 | 9/2003 | Ondricek et al. |
| 6,627,980 | B2 | 9/2003 | Eldridge |
| 6,628,503 | B2 | 9/2003 | Sogard |
| 6,628,980 | B2 | 9/2003 | Atalar et al. |
| 6,633,174 | B1 | 10/2003 | Satya et al. |
| 6,636,182 | B2 | 10/2003 | Mehltretter |
| 6,639,461 | B1 | 10/2003 | Tam et al. |
| 6,640,415 | B2 | 11/2003 | Eslamy et al. |

| Patent No. | Date | Inventor |
|---|---|---|
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,741,129 B1 | 5/2004 | Corsi et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,759,859 B2 | 7/2004 | Deng et al. |
| 6,764,869 B2 | 7/2004 | Eldridge |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,934 B2 | 9/2004 | Betti-Berutto et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,816,840 B1 | 11/2004 | Goodwin, III |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,893 B2 | 1/2005 | Khandros et al. |
| 6,839,964 B2 | 1/2005 | Henson |
| 6,845,491 B2 | 1/2005 | Miller et al. |
| 6,850,082 B2 | 2/2005 | Schwindt |
| 6,856,129 B2 | 2/2005 | Thomas et al. |
| 6,856,150 B2 | 2/2005 | Sporck et al. |
| 6,862,727 B2 | 3/2005 | Stevens |
| 6,864,105 B2 | 3/2005 | Grube et al. |
| 6,864,694 B2 | 3/2005 | McTigue |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B2 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |

| | | | | | | |
|---|---|---|---|---|---|---|
| 6,933,737 B2 | 8/2005 | Sugawara | 7,271,603 B2 | 9/2007 | Gleason et al. | |
| 6,937,020 B2 | 8/2005 | Munson et al. | 7,276,922 B2 * | 10/2007 | Miller et al. | 324/754 |
| 6,937,037 B2 | 8/2005 | Eldridge et al. | 7,327,153 B2 * | 2/2008 | Weinraub | 324/763 |
| 6,937,040 B2 | 8/2005 | Maeda et al. | 2001/0002794 A1 | 6/2001 | Draving | |
| 6,937,042 B2 | 8/2005 | Yoshida et al. | 2001/0009061 A1 | 7/2001 | Gleason et al. | |
| 6,937,045 B2 | 8/2005 | Sinclair | 2001/0009377 A1 | 7/2001 | Schwindt et al. | |
| 6,937,341 B1 | 8/2005 | Woollam et al. | 2001/0010468 A1 | 8/2001 | Gleason et al. | |
| 6,940,264 B2 | 9/2005 | Ryken, Jr. et al. | 2001/0020283 A1 | 9/2001 | Sakaguchi | |
| 6,940,283 B2 | 9/2005 | McQueeney | 2001/0024116 A1 | 9/2001 | Draving | |
| 6,943,563 B2 | 9/2005 | Martens | 2001/0030549 A1 | 10/2001 | Gleason et al. | |
| 6,943,571 B2 | 9/2005 | Worledge | 2001/0043073 A1 | 11/2001 | Montoya | |
| 6,943,574 B2 | 9/2005 | Altmann et al. | 2001/0044152 A1 | 11/2001 | Burnett | |
| 6,944,380 B1 | 9/2005 | Hideo et al. | 2001/0045511 A1 | 11/2001 | Moore et al. | |
| 6,946,375 B2 | 9/2005 | Karavakis et al. | 2001/0054906 A1 | 12/2001 | Fujimura | |
| 6,946,860 B2 | 9/2005 | Cheng et al. | 2002/0005728 A1 | 1/2002 | Babson et al. | |
| 6,948,391 B2 | 9/2005 | Brassell et al. | 2002/0008533 A1 | 1/2002 | Ito et al. | |
| 6,948,981 B2 | 9/2005 | Pade | 2002/0009377 A1 | 1/2002 | Shafer | |
| 6,949,942 B2 | 9/2005 | Eldridge et al. | 2002/0009378 A1 | 1/2002 | Obara | |
| 6,970,001 B2 | 11/2005 | Chheda et al. | 2002/0011859 A1 | 1/2002 | Smith et al. | |
| 6,987,483 B2 | 1/2006 | Tran | 2002/0011863 A1 | 1/2002 | Takahashi et al. | |
| 7,001,785 B1 | 2/2006 | Chen | 2002/0050828 A1 | 5/2002 | Seward, IV et al. | |
| 7,002,133 B2 | 2/2006 | Beausoleil et al. | 2002/0070743 A1 | 6/2002 | Felici et al. | |
| 7,002,363 B2 | 2/2006 | Mathieu | 2002/0070745 A1 | 6/2002 | Johnson et al. | |
| 7,002,364 B2 | 2/2006 | Kang et al. | 2002/0079911 A1 | 6/2002 | Schwindt | |
| 7,003,184 B2 | 2/2006 | Ronnekleiv et al. | 2002/0109088 A1 | 8/2002 | Nara et al. | |
| 7,005,842 B2 | 2/2006 | Fink et al. | 2002/0118034 A1 | 8/2002 | Laureanti | |
| 7,005,868 B2 | 2/2006 | McTigue | 2002/0149377 A1 | 10/2002 | Hefti et al. | |
| 7,005,879 B1 | 2/2006 | Robertazzi | 2002/0153909 A1 | 10/2002 | Petersen et al. | |
| 7,006,046 B2 | 2/2006 | Aisenbrey | 2002/0163769 A1 | 11/2002 | Brown | |
| 7,007,380 B2 | 3/2006 | Das et al. | 2002/0168659 A1 | 11/2002 | Hefti et al. | |
| 7,009,188 B2 | 3/2006 | Wang | 2002/0176160 A1 | 11/2002 | Suzuki et al. | |
| 7,009,383 B2 | 3/2006 | Harwood et al. | 2002/0180466 A1 | 12/2002 | Hiramatsu et al. | |
| 7,009,415 B2 | 3/2006 | Kobayashi et al. | 2002/0197709 A1 | 12/2002 | van der Weide et al. | |
| 7,011,531 B2 | 3/2006 | Egitto et al. | 2003/0010877 A1 | 1/2003 | Landreville et al. | |
| 7,012,425 B2 | 3/2006 | Shoji | 2003/0030822 A1 | 2/2003 | Finarov | |
| 7,012,441 B2 | 3/2006 | Chou et al. | 2003/0032000 A1 | 2/2003 | Liu et al. | |
| 7,013,221 B1 | 3/2006 | Friend et al. | 2003/0040004 A1 | 2/2003 | Hefti et al. | |
| 7,014,499 B2 | 3/2006 | Yoon | 2003/0057513 A1 | 3/2003 | Leedy | |
| 7,015,455 B2 | 3/2006 | Mitsuoka et al. | 2003/0062915 A1 | 4/2003 | Arnold et al. | |
| 7,015,689 B2 | 3/2006 | Kasajima et al. | 2003/0072549 A1 | 4/2003 | Facer et al. | |
| 7,015,690 B2 | 3/2006 | Wang et al. | 2003/0076585 A1 | 4/2003 | Ledley | |
| 7,015,703 B2 | 3/2006 | Hopkins et al. | 2003/0077649 A1 | 4/2003 | Cho et al. | |
| 7,015,707 B2 | 3/2006 | Cherian | 2003/0088180 A1 | 5/2003 | Van Veen et al. | |
| 7,015,708 B2 | 3/2006 | Beckous et al. | 2003/0119057 A1 | 6/2003 | Gascoyne et al. | |
| 7,015,709 B2 | 3/2006 | Capps et al. | 2003/0139662 A1 | 7/2003 | Seidman | |
| 7,015,710 B2 | 3/2006 | Yoshida et al. | 2003/0139790 A1 | 7/2003 | Ingle et al. | |
| 7,015,711 B2 | 3/2006 | Rothaug et al. | 2003/0155939 A1 | 8/2003 | Lutz et al. | |
| 7,019,541 B2 | 3/2006 | Kittrell | 2003/0170898 A1 | 9/2003 | Gunderson et al. | |
| 7,019,544 B1 | 3/2006 | Jacobs et al. | 2003/0184332 A1 | 10/2003 | Tomimatsu et al. | |
| 7,019,701 B2 | 3/2006 | Ohno et al. | 2003/0215966 A1 | 11/2003 | Rolda et al. | |
| 7,020,360 B2 | 3/2006 | Satomura et al. | 2004/0015060 A1 | 1/2004 | Samsoondar et al. | |
| 7,020,363 B2 | 3/2006 | Johannessen | 2004/0021475 A1 | 2/2004 | Ito et al. | |
| 7,022,976 B1 | 4/2006 | Santana, Jr. et al. | 2004/0061514 A1 | 4/2004 | Schwindt et al. | |
| 7,022,985 B2 | 4/2006 | Knebel et al. | 2004/0066181 A1 | 4/2004 | Theis | |
| 7,023,225 B2 | 4/2006 | Blackwood | 2004/0069776 A1 | 4/2004 | Fagrell et al. | |
| 7,023,226 B2 | 4/2006 | Okumura et al. | 2004/0090223 A1 | 5/2004 | Yonezawa | |
| 7,023,231 B2 | 4/2006 | Howland, Jr. et al. | 2004/0095145 A1 | 5/2004 | Boudiaf et al. | |
| 7,025,628 B2 | 4/2006 | LaMeres et al. | 2004/0095641 A1 | 5/2004 | Russum et al. | |
| 7,026,832 B2 | 4/2006 | Chaya et al. | 2004/0100276 A1 | 5/2004 | Fanton | |
| 7,026,833 B2 | 4/2006 | Rincon et al. | 2004/0100297 A1 | 5/2004 | Tanioka et al. | |
| 7,026,834 B2 | 4/2006 | Hwang | 2004/0108847 A1 | 6/2004 | Stoll et al. | |
| 7,026,835 B2 | 4/2006 | Farnworth et al. | 2004/0113640 A1 | 6/2004 | Cooper et al. | |
| 7,030,599 B2 | 4/2006 | Douglas | 2004/0130787 A1 | 7/2004 | Thome-Forster et al. | |
| 7,030,827 B2 | 4/2006 | Mahler et al. | 2004/0132222 A1 | 7/2004 | Hembree et al. | |
| 7,032,307 B2 | 4/2006 | Matsunaga et al. | 2004/0134899 A1 | 7/2004 | Hiramatsu et al. | |
| 7,034,553 B2 | 4/2006 | Gilboe | 2004/0140819 A1 | 7/2004 | McTigue et al. | |
| 7,035,738 B2 | 4/2006 | Matsumoto et al. | 2004/0147034 A1 | 7/2004 | Gore et al. | |
| 7,071,722 B2 | 7/2006 | Yamada et al. | 2004/0162689 A1 | 8/2004 | Jamneala et al. | |
| 7,088,981 B2 | 8/2006 | Chang | 2004/0170312 A1 | 9/2004 | Soenksen | |
| 7,096,133 B1 | 8/2006 | Martin et al. | 2004/0175294 A1 | 9/2004 | Ellison et al. | |
| 7,161,363 B2 | 1/2007 | Gleason et al. | 2004/0186382 A1 | 9/2004 | Modell et al. | |
| 7,187,188 B2 | 3/2007 | Andrews et al. | 2004/0193382 A1 | 9/2004 | Adamian et al. | |
| 7,188,037 B2 | 3/2007 | Hidehira | 2004/0197771 A1 | 10/2004 | Powers et al. | |

| | | | |
|---|---|---|---|
| 2004/0199350 A1 | 10/2004 | Blackham et al. | |
| 2004/0201388 A1 | 10/2004 | Barr | |
| 2004/0207072 A1 | 10/2004 | Hiramatsu et al. | |
| 2004/0207424 A1 | 10/2004 | Hollman | |
| 2004/0239338 A1 | 12/2004 | Johnson et al. | |
| 2004/0246004 A1 | 12/2004 | Heuermann | |
| 2004/0251922 A1 | 12/2004 | Martens et al. | |
| 2005/0024069 A1 | 2/2005 | Hayden et al. | |
| 2005/0026276 A1 | 2/2005 | Chou | |
| 2005/0030047 A1 | 2/2005 | Adamian | |
| 2005/0054029 A1 | 3/2005 | Tomimatsu et al. | |
| 2005/0062533 A1 | 3/2005 | Vice | |
| 2005/0068054 A1 | 3/2005 | Mok et al. | |
| 2005/0083130 A1 | 4/2005 | Grilo | |
| 2005/0088191 A1 | 4/2005 | Lesher | |
| 2005/0101846 A1 | 5/2005 | Fine et al. | |
| 2005/0116730 A1 | 6/2005 | Hsu | |
| 2005/0142033 A1 | 6/2005 | Glezer et al. | |
| 2005/0151548 A1 | 7/2005 | Hayden et al. | |
| 2005/0156675 A1 | 7/2005 | Rohde et al. | |
| 2005/0164160 A1 | 7/2005 | Gunter et al. | |
| 2005/0165316 A1 | 7/2005 | Lowery et al. | |
| 2005/0168722 A1 | 8/2005 | Forstner et al. | |
| 2005/0174191 A1 | 8/2005 | Brunker et al. | |
| 2005/0178980 A1 | 8/2005 | Skidmore et al. | |
| 2005/0195124 A1 | 9/2005 | Puente Baliarda et al. | |
| 2005/0229053 A1 | 10/2005 | Sunter | |
| 2005/0236587 A1 | 10/2005 | Kodama et al. | |
| 2005/0237102 A1 | 10/2005 | Tanaka | |
| 2006/0030060 A1 | 2/2006 | Noguchi et al. | |
| 2006/0052075 A1 | 3/2006 | Galivanche et al. | |
| 2006/0155270 A1 | 7/2006 | Hancock et al. | |
| 2006/0184041 A1 | 8/2006 | Andrews et al. | |
| 2006/0226864 A1 | 10/2006 | Kramer | |
| 2007/0024506 A1 | 2/2007 | Hardacker | |
| 2007/0030021 A1 | 2/2007 | Cowan et al. | |

FOREIGN PATENT DOCUMENTS

| | | |
|---|---|---|
| CN | 1083975 | 3/1994 |
| DE | 2951072 | 7/1981 |
| DE | 3426565 | 1/1986 |
| DE | 3637549 | 5/1988 |
| DE | 288234 | 3/1991 |
| DE | 4223658 | 1/1993 |
| DE | 9313420 | 10/1993 |
| DE | 19522774 | 1/1997 |
| DE | 19542955 | 5/1997 |
| DE | 19618717 | 1/1998 |
| DE | 19749687 | 5/1998 |
| DE | 29809568 | 10/1998 |
| DE | 10000324 | 7/2001 |
| DE | 20220754 | 5/2004 |
| EP | 0230766 | 12/1985 |
| EP | 0195520 | 9/1986 |
| EP | 0230348 | 7/1987 |
| EP | 0259163 | 3/1988 |
| EP | 0259183 | 3/1988 |
| EP | 0259942 | 3/1988 |
| EP | 0261986 | 3/1988 |
| EP | 0270422 | 6/1988 |
| EP | 0333521 | 9/1989 |
| EP | 0460911 | 12/1991 |
| EP | 0846476 | 6/1998 |
| EP | 0945736 | 9/1999 |
| GB | 579665 | 8/1946 |
| GB | 2014315 | 8/1979 |
| GB | 2179458 | 3/1987 |
| JP | 52-19046 | 2/1977 |
| JP | 53-037077 | 4/1978 |
| JP | 53037077 | 4/1978 |
| JP | 53-052354 | 5/1978 |
| JP | 55-115383 | 9/1980 |
| JP | 55115383 | 9/1980 |
| JP | 56-007439 | 1/1981 |
| JP | 56-88333 | 7/1981 |
| JP | 5691503 | 7/1981 |
| JP | 56088333 | 7/1981 |
| JP | 57-075480 | 5/1982 |
| JP | 57075480 | 5/1982 |
| JP | 57-163035 | 10/1982 |
| JP | 57163035 | 10/1982 |
| JP | 57171805 | 10/1982 |
| JP | 594189 U | 1/1984 |
| JP | 60-5462 | 4/1984 |
| JP | 60-236241 | 11/1985 |
| JP | 61142803 | 6/1986 |
| JP | 62-11243 | 1/1987 |
| JP | 62-51235 | 3/1987 |
| JP | 62-098634 | 5/1987 |
| JP | 62-107937 | 5/1987 |
| JP | 62098634 | 5/1987 |
| JP | 62107937 | 5/1987 |
| JP | 62-179126 | 8/1987 |
| JP | 62-239050 | 10/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 1-165968 | 6/1989 |
| JP | 1-214038 | 8/1989 |
| JP | 64-21309 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-124469 | 5/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3-196206 | 8/1991 |
| JP | 3196206 | 8/1991 |
| JP | 3-228348 | 10/1991 |
| JP | 03228348 | 10/1991 |
| JP | 4-130639 | 5/1992 |
| JP | 04130639 | 5/1992 |
| JP | 4-159043 | 6/1992 |
| JP | 04159043 | 6/1992 |
| JP | 4-206930 | 7/1992 |
| JP | 04206930 | 7/1992 |
| JP | 4-340248 | 11/1992 |
| JP | 5-082631 | 4/1993 |
| JP | 05082631 | 4/1993 |
| JP | 5-113451 | 5/1993 |
| JP | 51-57790 | 6/1993 |
| JP | 5157790 | 6/1993 |
| JP | 51-66893 | 7/1993 |
| JP | 5166893 | 7/1993 |
| JP | 58-130602 | 8/1993 |
| JP | 6-85044 | 3/1994 |
| JP | 60-71425 | 3/1994 |
| JP | 6-102313 | 4/1994 |
| JP | 6-132709 | 5/1994 |
| JP | 6154238 | 6/1994 |
| JP | 6-295949 | 10/1994 |
| JP | 7-005078 | 1/1995 |
| JP | 7-12871 | 1/1995 |
| JP | 7005078 | 1/1995 |
| JP | 7012871 | 1/1995 |
| JP | 8035987 | 2/1996 |

| | | |
|---|---|---|
| JP | 8-261898 | 10/1996 |
| JP | 8-330401 | 12/1996 |
| JP | 08330401 | 12/1996 |
| JP | 09127432 | 5/1997 |
| JP | 8-35987 | 2/1998 |
| JP | 10-48256 | 2/1998 |
| JP | 10-116866 | 5/1998 |
| JP | 10116866 | 5/1998 |
| JP | 11-023975 | 1/1999 |
| JP | 11004001 | 1/1999 |
| JP | 11023975 | 1/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO98/07040 | 2/1998 |
| WO | W00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn, Seymour B., "Optimum Design of Stepped Transmission-Line Transformers," I.R.E. Transactions—Microwave Theory and Techniques, No. 3, 1955, pp. 16-21.
Hopper, Samuel, "The Design of Ridged Waveguides," I.R.E. Transactions—Microwave Theory and techniques, No. 5, Oct. 1955, pp. 20-29.
Chen, Tsung-Shan, "Calculation of Parameters of Ridge Waveguides," IRE Transactions on Microwave Theory and Techniques, Jan. 1957, pp. 12-17.
IRE 20.1, Committee Personnel, "IRE Standards on Methods of Measuring Noise in Linear Twoports, 1959," Proc. IRE, vol. 48, pp. 60-68, Jan. 1960, pp. 32-40.
Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.
Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.
Lane, Richard Q., "The Determination of Device Noise Parameters," Proc. IEEE, vol. 57, Aug. 1969, pp. 1461-1462.
Adamian, Vaheh, et al., "A Novel Procedure for Receiver Noise Characterization," IEEE Transactions on Instrumentation and Measurement, Jun. 1973.
Daly, P., "Polar Geometry Waveguides by finite-element Methods," IEEE Transactions on Microwave Theory and Technique, vol. MTT-22, No. 3, Mar. 1974, pp. 202-209.
Fink, Donald G., et al., "Electronics Engineers' Handbook," Sec. 17-52 Measurement and Control Circuits, 1975, pp. 17-22-17-27.
Bry, A., et al, "Bypass Capacitor for Chip Probe," IBM Technical Disclosure Bulletin, vol. 18, No. 11, Apr. 1976.
Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.
Eisenhart, R.L., "A Better Microstrip Connector," 1978 IEEE MTT-S International Microwave Symposium Digest, Jun. 27-29, Ottawa, Canada.
Gommlich, Hans, et al., "Verzerrungsmessungen-Wichtige Aufgabe in der Ubertragungstechnik," Elektronik 8/ Apr. 23, 1982, pp. 110-119.
Larock, V., et al., "Automatic Noise Temperature Measurement Through Frequency Variation," IEEE Transactions on Microwave Theory and Techniques, vol. MTT-30, No. 8, Aug. 1982, pp. 1286-1288.
Maury Microwave Corp., "Transistor Test Fixture (TTF) Inserts, Calibration & Check Devices, MT951, MT952, MT953 Series," Advanced Data 4T-002, Sep. 20, 1982, pp. 1-2.
Maury Microwave Corp., "Transistor Test Fixture (TTF) Software," MT950D Series, Sep. 20, 1982, 2 pages.
Maury Microwave Corp., "Transistor Test Fixture (TTF)," MT950 Series, Advanced data 4T-001, Oct. 7, 1982.
Abbott, D.A., et al., "Automatic noise figure measurements with computer control and correction," 8054 Radio and Electronic Engineer vol. 52, Oct. 1982, pp. 468-474.
Swain, Howard L. et al., "Noise Figure Meter Sets Records for Accuracy, Repeatability, and Convenience," 1266 Hewlett-Packard Journal, vol. 34, No. 4, Apr. 1983, pp. 23-34.
Adamian, V. et al., "Simplified Noise Evaluation of Microwave Receiver," IEEE Transactions on Instrumentation and Measurement, vol. IM-33, No. 2, Jun. 1984, 136-140.
Pastori, William E., "High accuracy microwave noise figure measurements," 8029 Electronic Engineering 56, No. 1984, pp. 181-189.
Inter-Continental Microwave, "Product Catalog," VMC 1055 Jan. 1986.
Design Technique, "Microstrip Microwave Test Fixture," May 1986.
Cascade Microtech, Inc., "Wide Probe Assembly," Full Scale Drawing, May 29, 1986, 2 pages.
Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.
Sharma, A., "Tunable Waveguide-to-Microstrip Transition for Millimeter-Wave Applications," IEE MTTS-S Digest 1987, pp. 353-356.
Izadian, Jamal S., "Unified Design Plans Aid Waveguide Transitions," Microwaves & R&F, May 1987, pp. 213-222.
Mazilu, T., "A Self-Adjusting Waveguide-to-Microstrip Transition," Microwave Journal, Jul. 1987, pp. 133-134.
Carlton, D.E. et al., "Accurate Measurement of High-speed Package and Interconnect Parasitics," IEEE 1988 Custom Integrated Circuits Conference, pp. 23.3.1-23.3.6.
Fraser, Arthur, et al., "GHz On-Silicon-Wafer Probing Calibration Methods," Paper 7.6, IEEE 1988 Bipolar Circuits & Technology Meeting, pp. 154-157.
Modolo, John A., et al, "Wafer level high-frequency measurements of photodetector characteristics," Applied Optics, vol. 27, pp. 3059-3069, Aug. 1988.
Design Technique, Adjustable Test Fixture, 1988.
Tong, Peter R., et al., "Noise Measurements at MM-Wave Frequencies," 176 Microwave Journal Jul. 31, 1988.
Barsotti, C., et al., "New Prove Cards Replace Needle Types," Semiconductor International, Aug. 1988, pp. 98-101.
Microwave Journal, "Microwave Products," Sep. 1988, pp. 297.
Cascade Microtech Microprobe Update, "Spurious propagation, modes removed by probe absorber," Apr. 1989.
Esteban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.
Ponchak, George, et al., "A New Rectangular Waveguide to Coplaner Waveguide Transition," Prepared for 1990 IEEE MTT-S International Microwave Symposium to be held between May 8-10, in Dallas, Texas, Jan. 1990.
Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements," IEEE MTT-S Digest, 1993, pp. 1335-1338.

Photo of Micromanipulator Probe Station, 1994.

Maury Microwave Corp., Transistor Test Fixture (TTF) MT950 Series, May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Basu, S., et al, "A Membrane Quandrant Probe for R&D Applications," Cascade Microtech, Inc. At Least one year prior to filing.

Electrical Operation, Calibration and Measurement Steps with the HP 8510, At least one year prior to filing.

Whinnery, J.R. et al., "Equivalent Circuits for Discontinuities in Transmission Lines," Proceedings of IRE, at least one year prior to filing.

Inter-Continental Microwave, Application Note: 101, Microwave Semiconductor Chip Measurements using the HP 8510B TRL-Calibration Technique, at least one year prior to filing.

Cascade Microtech, "Special Purpose Probe 40/80 Gb/s High Performance Quandrant," at least one year prior to filing.

Agilent Technology Product Information, HPW281D Waveguide Adapter, 1 mm (m) to W-Band, 75 GHz to 110 GHz.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's 1980 IEEE MTT-S International Microwave Symposium Digest, Washington, DC, May 28-30, 1980.

The Micromanipulator Company, data sheet, Double Sided Probing System, Jul. 2002, 2 pages.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003. pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Waveguide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

* cited by examiner

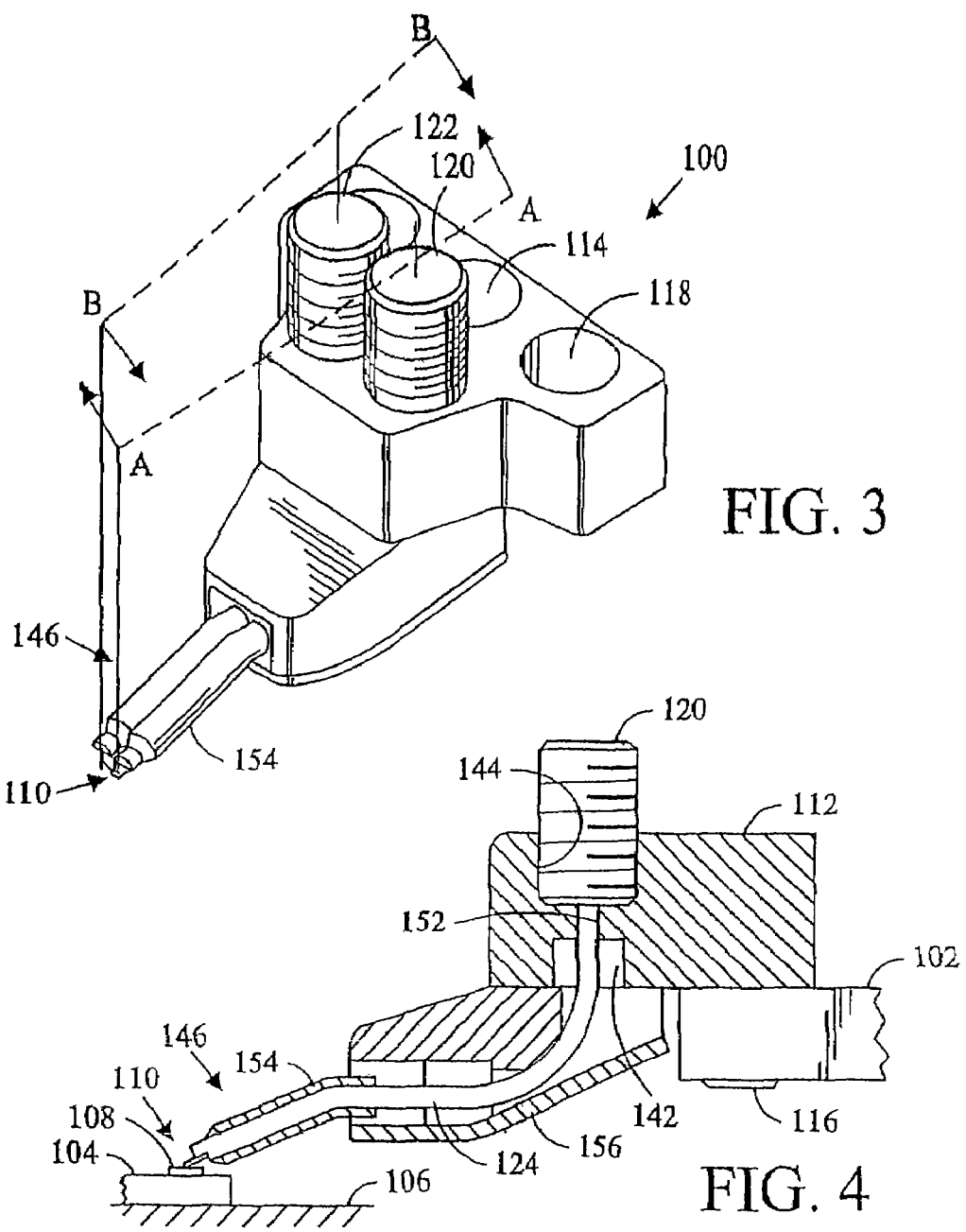
FIG. 3
FIG. 4
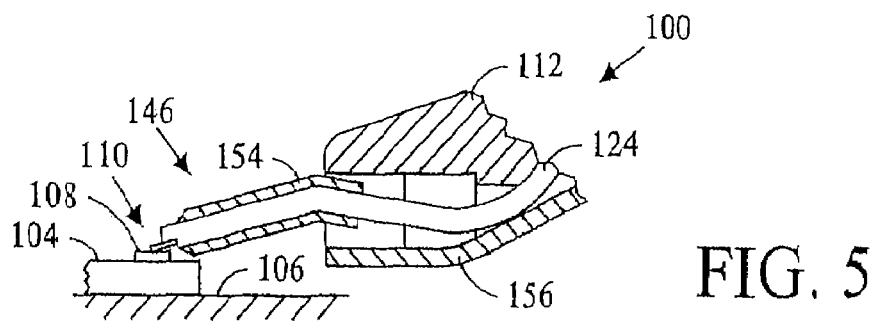
FIG. 5

PROBE FOR COMBINED SIGNALS

CROSS-REFERENCE TO RELATED APPLICATIONS

This application is a continuation of U.S. patent application Ser. No. 11/901,626, filed Sep. 18, 2007, which is a continuation of U.S. patent application Ser. No. 11/714,003, filed Mar. 5, 2007, now U.S. Pat. No. 7,285,969; which is a continuation of U.S. patent application Ser. No. 11/442,503, filed May 25, 2006, now U.S. Pat. No. 7,205,784; which is a continuation of U.S. patent application Ser. No. 11/077,810, filed Mar. 9, 2005, now U.S. Pat. No. 7,075,320; which is a continuation of U.S. patent application Ser. No. 10/928,688, filed Aug. 26, 2004, now U.S. Pat. No. 7,046,023; which is a continuation of U.S. patent application Ser. No. 10/712,579, filed Nov. 12, 2003, now U.S. Pat. No. 6,806,724; which is a division of U.S. patent application Ser. No. 10/294,130, filed Nov. 13, 2002, now U.S. Pat. No. 6,724,205.

BACKGROUND OF THE INVENTION

The present invention relates to probe measurement systems for measuring the electrical characteristics of integrated circuits and other microelectronic devices tested by simultaneously applying a direct current and a modulation signal to the device-under-test.

There are many types of probing assemblies that have been developed for measuring the characteristics of integrated circuits and other forms of microelectronic devices. One representative type of assembly uses a circuit card on which are formed elongate conductive traces that serve as signal and ground lines. A central opening is formed in the card, and a needle-like probe tip is attached to the end of each trace adjacent the opening so that a radially extending array of downwardly converging needle-like tips is presented by the assembly for selective connection with the closely spaced contact pads of the microelectronic device being tested. A probe assembly of this type is shown, for example, in Harmon U.S. Pat. No. 3,445,770. This type of probing assembly, however, is unsuitable for use at higher frequencies, including microwave frequencies in the gigahertz range, because at such frequencies the needle-like tips act as inductive elements and because there are no adjoining elements present to suitably counteract this inductance with a capacitive effect in a manner that would create a broadband characteristic of more or less resistive effect. Accordingly, a probing assembly of the type just described is unsuitable for use at microwave frequencies due to the high levels of signal reflection and substantial inductive losses that occur at the needle-like probe tips.

One type of probing assembly that is capable of providing a controlled-impedance low-loss path between its input terminal and the probe tips is illustrated in Godshalk et al., U.S. Pat. No. 5,506,515. The probe has a tip assembly including a semi-rigid coaxial cable with a Teflon™ dielectric and a freely-suspended end. An inner finger and an outer pair of fingers are mounted on the freely-suspended end of the cable. Each of the fingers is made of resilient conductive material, so as to form a coplanar transmission line. Cantilevered portions of the fingers extend past the end of the cable to form an air-dielectric transmission path of uniform and stable characteristics despite exposure to numerous contact cycles. The fingers provide a suitable means for probing nonplanar wafer contact pads while promoting good visibility in the area of the contact pads. The characteristic impedance of typical microwave probes and cables is approximately 50 ohms closely matching the impedance of the typical microwave device-under-test (DUT) so broadband signals can travel through the probe with minimal loss.

However, when testing certain devices, such as laser diodes, the use of a typical microwave probe is problematic. Laser diode testing requires simultaneous application of a modulation signal and a DC electrical current to a contact pad of the device to generate a modulated light output. For testing, the modulation signal is typically a swept frequency sinusoid (AC) or a wide bandwidth pulsed waveform. The DC and modulation signals are superimposed and the combined signals are conducted to a contact tip of a probe in selective engagement with the contact pad of the DUT. Typically, the impedance seen by the modulation signal, the dynamic resistance of an active laser diode, for example, is on the order of five ohms. As a result, there is a significant impedance mismatch with the typical microwave probe and cable and the mismatched impedance distorts the modulation signal measured by the test instrumentation. While some instrumentation, such as a Vector Network Analyzer (VNA), can be calibrated to correct for distortion, the distortion can substantially affect measurements made with other instrumentation. Further, the distortion can have a magnitude sufficient to attenuate the modulation signal at some frequencies, causing a loss of dynamic range and accuracy for the measurements, even when made with a VNA.

To improve the impedance matching and reduce distortion of the modulation signal, an impedance matching resistor can be installed in series with the contact tip of a microwave probe. For testing laser diodes, the typical series impedance matching resistor has a value of 45 ohms, which in series with the five ohm dynamic resistance of a typical laser diode, provides a satisfactory impedance match with the probes and cables ($\approx$50 ohms) to substantially reduce distortion of the test signals. Resistors with other values can be incorporated into the probe to match impedance when testing other types of devices. However, since the modulation signal and the DC current are superimposed on the same conductor, both signals must pass through the series impedance-matching resistor which dissipates power equal to the product of the resistance and the square of the current. For DUTs requiring higher current levels, the power that must be dissipated by the resistor is substantial. On the other hand, to pass high frequency signals, the resistor must small in size and the distance between the resistor and the contact tip must be short to minimize parasitic series inductance and shunt capacitance. The performance of a probe with a series impedance matching resistor is compromised by the competing necessities of sufficient resistance to match the impedance of the probe and cables and minimized resistance to minimize the voltage drop and the power dissipated by the resistor.

What is desired, therefore, is a probing system and method having minimal resistance to minimize voltage drop and power dissipation combined with adequate resistance to match the impedance of the probe and cables to minimize modulation signal distortion when a direct current and a modulated signal are simultaneously applied to a DUT.

BRIEF DESCRIPTION OF THE DRAWINGS

FIG. 3 is a perspective view of a first embodiment of a combined signal probe.

FIG. 4 is a section view of the combined signal probe of FIG. 3 taken along line A-A just after contact has been made between the probe tip and a contact pad of a device-under-test.

FIG. 5 is a fragmentary view corresponding to FIG. 4 showing how the probe tip moves in relation to the body of the probe in response to a downward shift of the body in relation to the DUT.

DETAILED DESCRIPTION OF PREFERRED EMBODIMENTS

Figure 1:
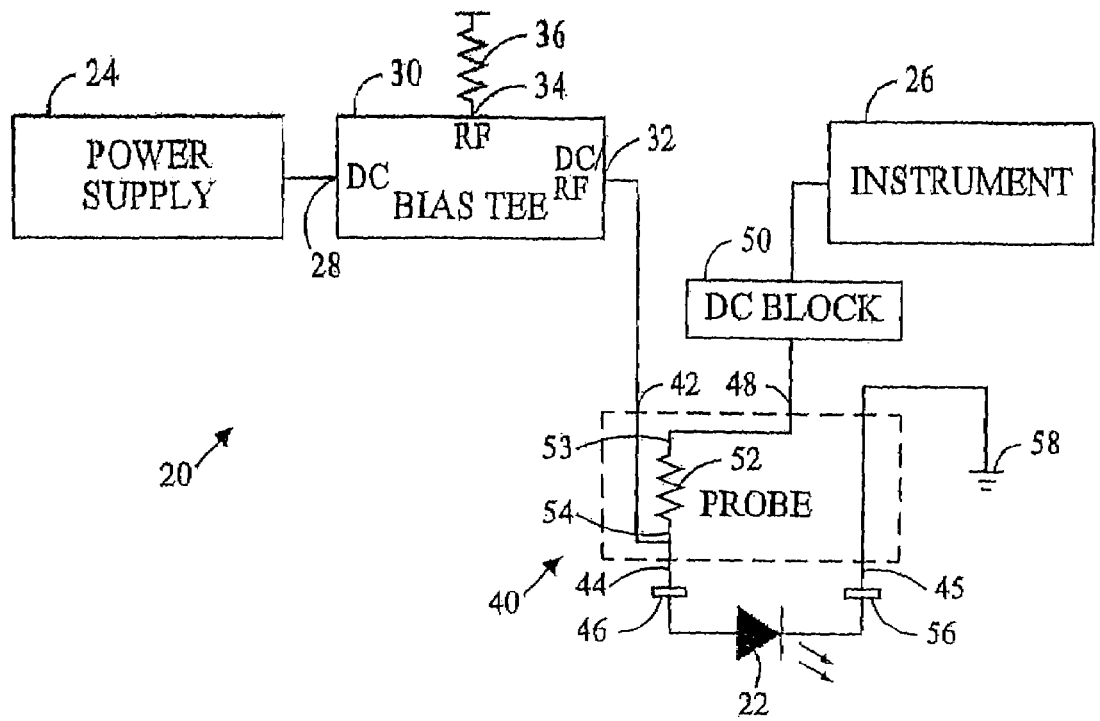
FIG. 1 is a schematic illustration of a first embodiment of a combined signal probing system.

On-wafer testing of certain devices requires the simultaneous application of direct current and a modulated signal to conductive contact pads on the wafer that correspond to the device-under-test (DUT). For example, to test a laser diode on a wafer, a DC current and a modulation signal are simultaneously applied to a contact pad for the diode. The DC current provides the power for generating light and the modulation signal varies lasing intensity to produce a modulated light output. For testing, the modulation signal is typically a swept frequency sinusoid (AC) or a wide bandwidth pulsed waveform. When testing a laser diode, the dynamic resistance of the operating diode which is typically on the order of five ohms is the impedance seen by the modulation signal. On the other hand, the typical microwave probe and cable has an impedance of approximately 50 ohms. As a result of the significant impedance mismatch, the modulation signal will be distorted. Some test instrumentation, such as a Vector Network Analyzer (VNA), can compensate for some signal distortion, but distortion compensation is not possible with other instrumentation. Further, the distortion may cause attenuation of the signal at certain frequencies adversely affecting the dynamic range and accuracy of measurements even when performed with a VNA.

To improve the impedance matching and reduce distortion of the modulation signal, a resistor can be incorporated into the tip of the probe. For example, an impedance matching resistor with a value of 45 ohms in series with the five ohm dynamic resistance of a typical operating laser diode provides a satisfactory impedance match with typical microwave probes and cables and substantially reduces signal distortion. However, since the modulation signal and the DC current are superimposed on the same conductor, both signals must pass through the series impedance-matching resistor resulting in a voltage drop and dissipation of power substantially equal to the product of the resistance and the square of the DC current. For devices requiring high current levels, the power that is dissipated by the resistor is substantial. However, to minimize parasitic series inductance and shunt capacitance of the probe, the size of the resistor must be minimized, limiting its capacity to dissipate power. Probe performance must be compromised to satisfy the competing requirements imposed on the impedance-matching resistor. Decreasing the resistance reduces the amount of power that is dissipated by the resistor but increases the impedance mismatch and the signal distortion. On the other hand, increasing the size of the resistor increases its capacity to dissipate power but also increases its inductance and capacitance and, consequently, the distortion of the modulation signal. The present inventor concluded that the performance of a probe applying a combined DC current and modulation signal to a DUT could be improved if the signal paths could be separated so that the modulated signal was transmitted over a signal path having a matched impedance while the DC current flow was transmitted over a signal path with minimal resistance to minimize loss and power dissipation.

Referring in detail to the drawings wherein similar parts of the invention are identified by like reference numerals, and more particularly to FIG. 1, an on-wafer probing system 20 for testing a DUT 22 (for example, a laser diode) requiring simultaneous application of DC current and a modulated signal includes a DC power supply 24 and a high speed test instrument 26 such as a VNA or a Bit-Error-Rate tester supplying a modulation signal. The DC power supply 24 is connected to the DC port 28 of a bias-tee 30. A bias tee 30 is a device used to superimpose a direct current and a modulation signal or for extracting a direct current component from a combined signal without affecting the high frequency component of the signal. The combined DC/RF port 32 of the bias tee 30 is connected to a first input port 42 of the combined signal probe 40. The modulated signal or radio frequency (RF) port 34 of the bias tee 30 is connected to a termination resistor 36 to provide an impedance matched termination for the modulation signal imposed on the conductor connecting the bias tee and the combined signal probe. The first input port 42 of the combined signal probe 40 is conductively connected to a signal contact tip 44 that is arranged to selectively engage a signal contact pad 46 of the DUT 22 (a laser diode).

On the other hand, the modulation signal, generated by the instrumentation 26 of the probing system 20, is transmitted to a DC block 50. The DC block 50 comprises, generally, series capacitance that blocks the flow of DC current into the instrumentation 26 over the conductor that connects the instrumentation 26 to the combined signal probe 40. From the DC block 50 the modulation signal is transmitted to the second input port 48 of the combined signal probe 40 which is conductively connected to a first port 53 of an impedance-matching resistor 52. The second port 54 of the impedance matching resistor 52 is conductively connected to the signal contact tip 44 of the probe. A second contact pad 56 of the DUT 22 is grounded 58 through a ground contact tip 45 of the combined signal probe 40. The signal contact tip 44 and the ground contact tip 45 are arranged to simultaneously selectively engage, respectively, the signal contact pad 46 and the ground contact pad 56 of the DUT 22.

In the probing system 20, the modulation signal sees a termination comprising the impedance-matching resistor 52 in series with the parallel combination of the dynamic resistance of the DUT and the impedance seen looking from the first input port 42 back toward the bias tee 30. If the termination resistor 34 has a resistance matching the impedance of the connection between the bias tee 30 and the combined signal probe 40 then the impedance at the DUT is equal to the impedance of the connection between the bias tee and the combined signal probe. Typically, the connection between the bias tee 30 and the combined signal probe 40 comprises coaxial cable with an impedance of approximately 50 ohms. Since the impedance of the DUT is typically substantially less (typically, five ohms for a laser diode) than the impedance looking into the coaxial cable connection toward the bias tee 30, the parallel combination of impedances is dominated by the smaller impedance and the modulation signal path is approximately match terminated, minimizing distortion of the modulation signal. On the other hand, the signal path of the DC current powering the DUT does not pass through the impedance-matching resistor 52 so losses in the impedance-matching resistor are minimized. The probing system 20 permits a modulation signal to be transmitted to the DUT 22 over a first signal path that includes an impedance matching resistor 52 while a direct current is simultaneously transmitted to the DUT over a second signal path that does not traverse the impedance matching resistor.

Figure 2:
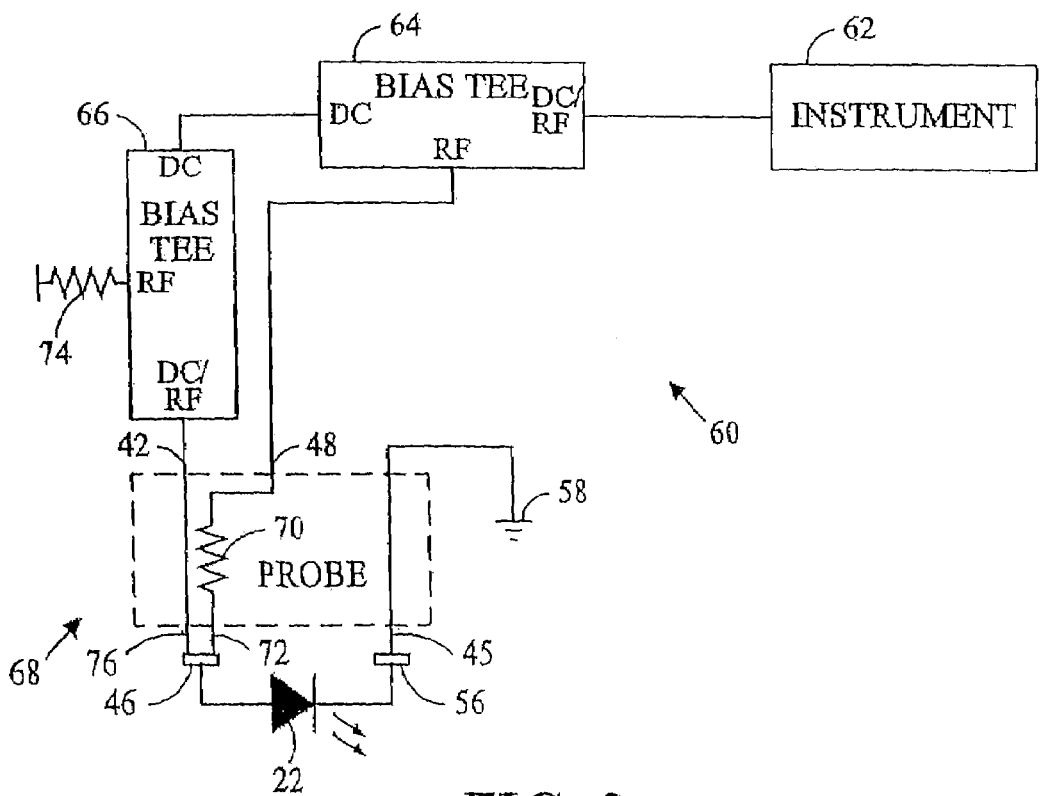
FIG. 2 is a schematic illustration of a second embodiment of a combined signal probing system.

Referring to FIG. 2, in a second embodiment of the probing system 60, the instrumentation 62 is the source of an offset modulation signal. The combined DC current and modulation signal are transmitted to a combined signal port of a first bias tee 64. In the first bias tee 64, the DC current and modulation signal components are separated. The modulation signal is transmitted to the first input port 48 of the combined signal probe 68 which is conductively connected to the first port of an impedance matching resistor 70. The second port of the impedance matching resistor 70 of the probe 68 is connected to a modulation signal contact tip 72 arranged to selectively engage the signal contact pad 46 of the DUT 22.

The DC current is transmitted from the first bias tee 64 to a second bias tee 66. The combined signal (DC/RF) port of the second bias tee 66 is connected to the second input port of the probe 42 which is conductively connected to a DC signal probe 76 arranged to engage the signal contact pad 46 of the DUT 22 when the modulation signal probe 72 is in engagement with the signal contact pad. An impedance matched termination for the modulation signal imposed on the conductor connecting the second bias tee 66 to the DC signal probe 76 is provided by a termination resistor 74 connected to the RF port of the second bias tee 66. As in the first embodiment, the modulation signal is applied to the signal contact pad 46 of the DUT 22 over a distortion minimizing impedance matched signal path while the DC current is simultaneously applied to the signal contact pad over a signal path that does not include the impedance matching resistor and, therefore, minimizes power dissipation.

Figure 9:
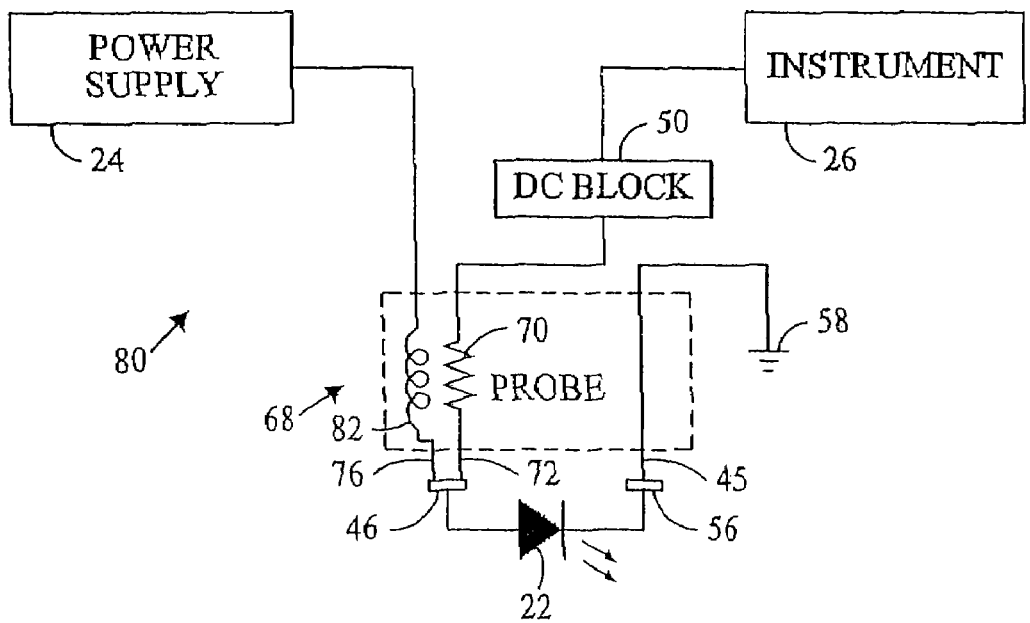
FIG. 9 is a schematic illustration of a third embodiment of a combined signal probing system.

Referring to FIG. 9, in still another embodiment of the probing system 80, the DC current is generated by a power supply 24 and transmitted to the DC signal contact tip 76 of the combined signal probe 68 over a signal path including inductance represented by the inductor 82. The modulation signal, generated by the instrumentation 26, is transmitted through the DC block 50 to the first input port 48 of the combined signal probe 68 which is conductively connected to the first port of the impedance matching resistor 70. The second port of the impedance matching resistor 70 is conductively connected to the modulation signal contact tip 72 which is arranged to engage the signal contact pad 46 of the DUT 22 when the DC signal contact tip 76 is in contact with the contact pad. The flow of DC current toward the instrumentation 26 is blocked by the capacitance of the DC block 50. At the frequency of the modulation signal, the impedance presented by the inductance 82 is substantially greater than impedance of the DUT, substantially blocking the passage of the modulation signal toward the power supply while permitting the DC current to flow, substantially unimpeded, to the combined signal probe 68 over a signal path that bypasses the impedance matching resistor 70. Distortion of the modulation signal is minimized by the impedance matching in the modulation signal path while power loss is minimized by avoiding the flow of current through the impedance matching resistor 70.

Referring to FIGS. 3, 4, 5, and 6, an exemplary first embodiment of a combined signal wafer probe 100 constructed in accordance with the present invention is designed to be mounted on a probe-supporting member 102 of a wafer probe station so as to be in suitable position for probing a DUT, such as an individual laser diode component on a wafer 104. In this type of application, the DUT is typically supported under vacuum pressure on the upper surface of a chuck 106 that is part of the probing station. Ordinarily an X-Y-Z positioning mechanism is provided, such as a micrometer knob assembly, to effect movement between the supporting member and the chuck so that the tip assembly 110 of the probe can be brought into pressing engagement with contact pads 108 on the DUT that correspond to the particular component requiring measurement.

With respect to its overall construction, the wafer probe 100 includes a primary support block 112 which, in the illustrated embodiment, is made of brass and which is suitably constructed for connection to the probe-supporting member 102. To effect this connection, a round opening 114 that is formed on the block is snugly fitted slidably onto an alignment pin (not shown) that upwardly projects from the probe-supporting member, and a pair of fastening screws 116 are inserted into a corresponding pair of countersunk openings 118 provided on the block for screwing engagement with the probe-supporting member, each within a respective threaded opening formed on that member.

As illustrated in FIG. 1, the first embodiment of the exemplary combined signal wafer probe 100 includes a first input port 120 and a second input port 122 which, in the preferred embodiment depicted, comprise spark-plug type, K-connectors. This connector enables the external connection of an ordinary coaxial cable to the input ports 120, 122 of the wafer probe. The connection of a coaxial cable to the first input port 120 permits a well-shielded high frequency transmission channel to be established between the probe and an attached measuring instrument 26. Likewise, a shielded high frequency transmission channel between the bias tee 66 and the combined signal wafer probe 100 is established by connecting a coaxial cable between the second input port 122 of the probe and the combined (DC/RF) port of the bias tee. If desired, other types of connectors can be used such as a 2.4 mm connector, a 1.85 mm connector or a 1 mm connector. The combined signal wafer probe 100 provides low-loss transmission paths having a controlled impedance characteristic from the input ports 120, 122 down to the contact tip assembly 110. The tip assembly 110 of the wafer probe is of particularly rugged construction and able to withstand in excess of 500,000 separate contact cycles without maintenance or repair. At the same time, the tip assembly is able to readily adapt to non-planar contact pad surfaces of a DUT on a wafer 104.

Figure 6:
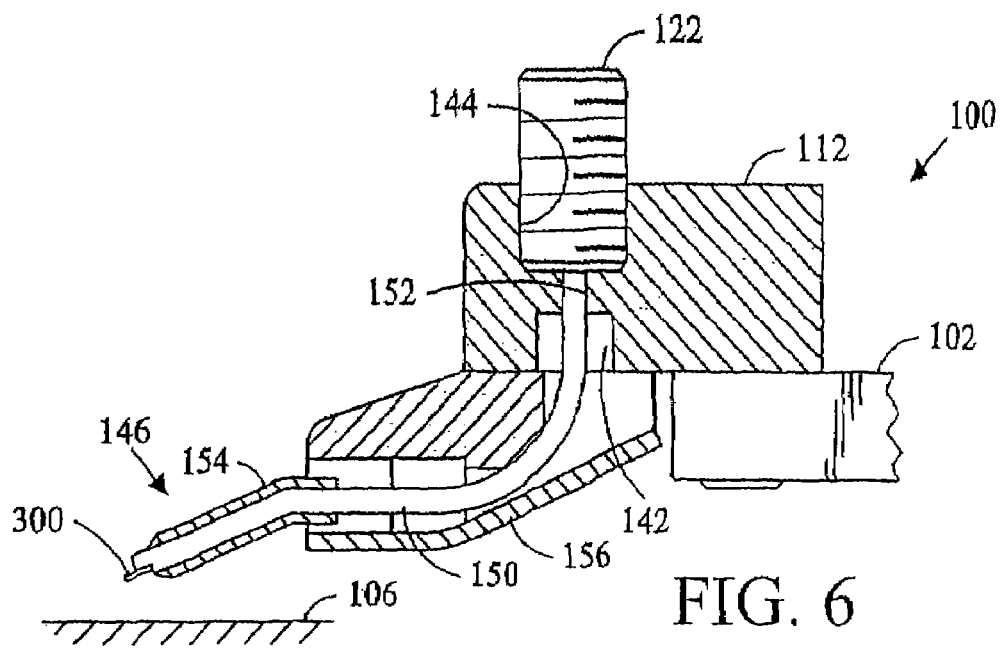
FIG. 6 is a section view of the combined signal probe of FIG. 3 taken along line B-B.
Figure 7:
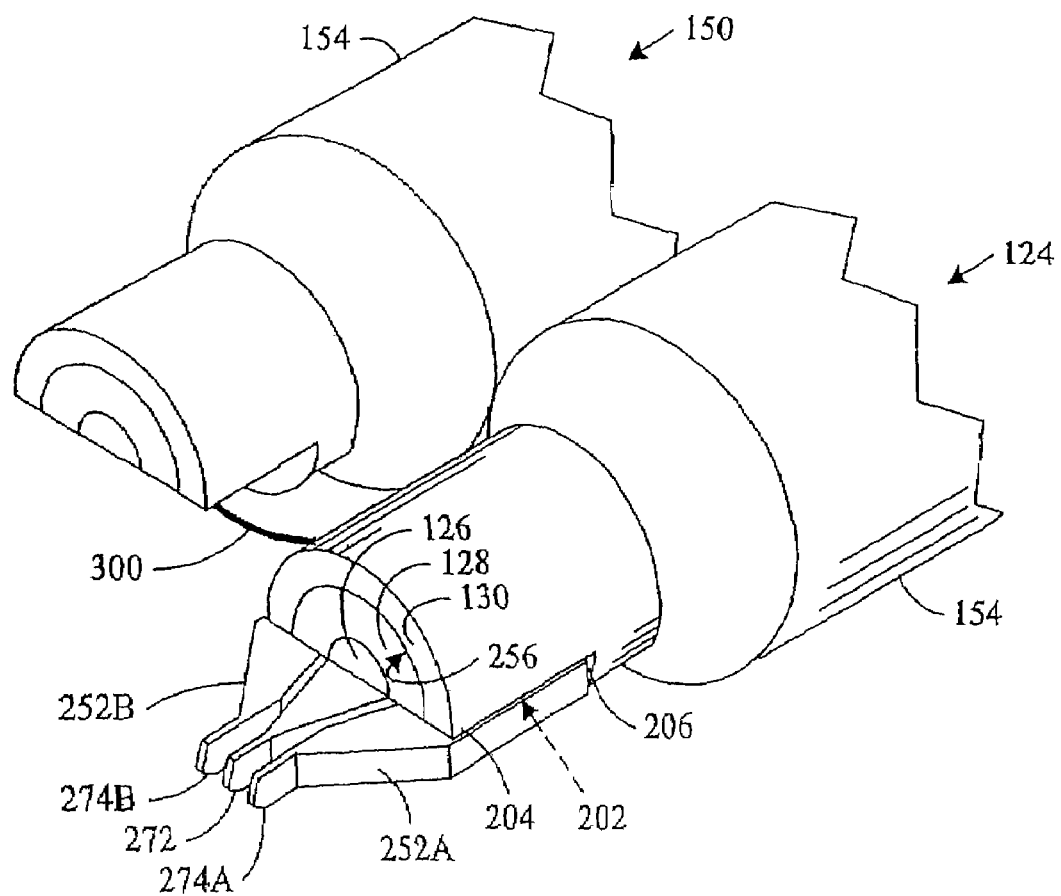
FIG. 7 is an enlarged perspective view of the probe tip of the combined signal probe of FIG. 3.

In the preferred embodiment shown in FIG. 4, a semirigid coaxial cable 124 is electrically connected at its rearward end to the K-connector of the first input port 120. Referring also to FIG. 7, this coaxial cable 124 includes an inner conductor 126, an inner dielectric 128 and an outer conductor 130 and is preferably of phase-stable, low-loss type. Similarly, as illustrated in FIG. 6, a semirigid coaxial cable 150 is connected at its rearward end to the K-connector at the second input port 122.

To prepare the rearward ends of the cables 124, 150 for connection to the appropriate K-connector, the rearward end is stripped to expose the inner conductor, and this inner conductor is temporarily held inside a dummy connector while the adjacent outer conductor is soldered within a bore 140, 152 formed in the primary support block 112. A recess 142 that is formed in the block below this bore provides access to facilitate the soldering process. The dummy connector is then removed and the K-connectors are screwably installed in threaded openings 144 formed on the block above the bore so as to effect electrical connection between the connectors and the coaxial cables 124, 150. A thread locking compound may be applied to the threads of the K-connectors prior to their installation to ensure a tight physical connection.

Referring to FIGS. 4 and 5 together, the forward end 146 of the cable 124 remains freely suspended and, in this condition, serves as a movable support for the probing end 110 of the probe. Before being connected to the K-connector of the first input port 120, the cable 124 is bent along first and second intermediate portions in the manner shown in FIG. 4 so that an upwardly curving 90° bend and a downwardly curving 23° bend, respectively, are formed in the cable. A tube 154 of semi-flexible microwave-absorbing material is slidably inserted over the protruding end of the coaxial cable 124. One material used for forming the tube is comprises iron and urethane. The bottom of the rigid support block 112 is covered with a soft and flexible sheet 156 formed of microwave-absorbing material so as to provide a cushioning layer along the bottom of that block. An example of material of suitable type for this purpose is a filled silicon rubber containing iron. The microwave-absorbing components on the exemplary probe, that is, the rigid support block 112, the flexible sheet 156 and the semi-flexible tube 154, cooperatively serve to substantially reduce the levels of microwave energy that travel along the outer conductor 130 of the semirigid cable 124 and other exterior probe structures.

As illustrated in FIG. 4, the combined signal probe 100 is positioned so that the probe tip 110 is brought into contact with the contact pad 108 of the DUT. After probe tip 110 is brought into pressing engagement with its corresponding contact pad the vertical spacing between the probe 100 and the device-under-test is then reduced even further, as depicted in FIG. 5, causing the coaxial cable 124 to bend and causing the contact tip to wipe across the surface of the corresponding contact pad 108, as indicated.

Prior to its connection to the K-connector of the input port 120, a semicylindrical recess 202 is formed in each of the cables 124, 150 adjacent their forward ends as shown in FIG. 7. This recess is formed by making a longitudinal cut through the cable and by making a transverse cut at the end of the longitudinal cut. In accordance with this procedure, a semicylindrical portion of the outer conductor 130, the inner dielectric 128, and the inner conductor 126 are removed, as so that the remaining portions of these elements together form a flat shelf 204 that extends to the forward end of the cable as well as a back face 206 that extends crosswise in relation to the length of the cable.

Figure 8:
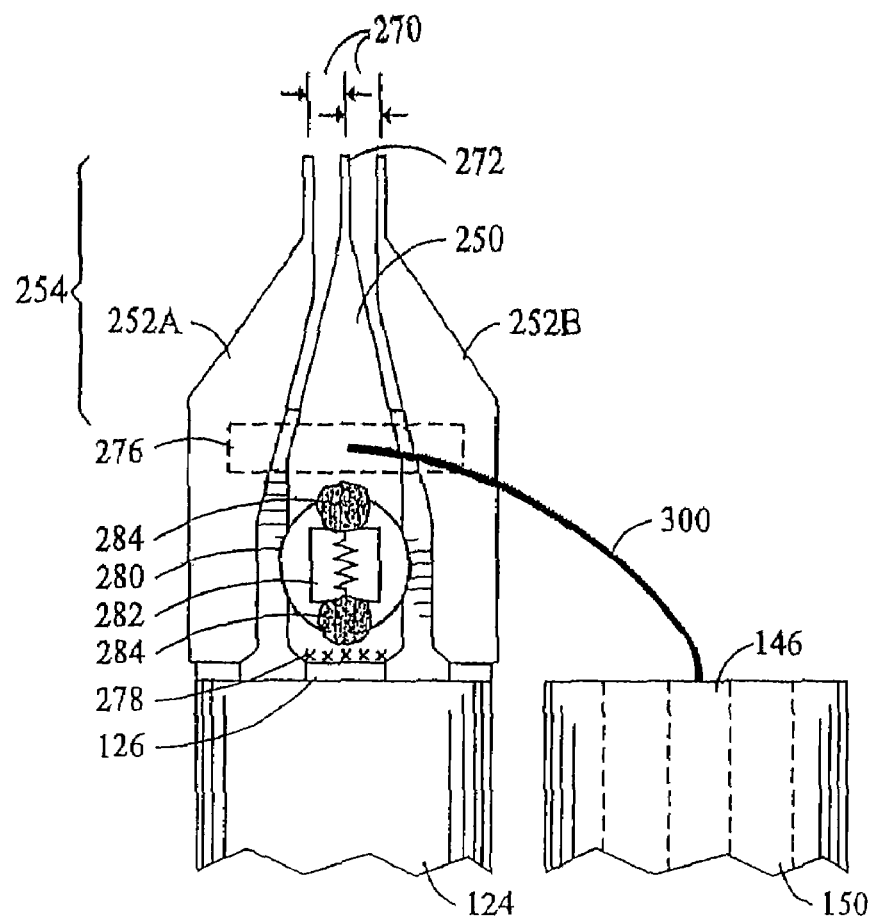
FIG. 8 is a bottom view of the probe tip of FIG. 7.

Referring to FIGS. 7 and 8, at the probing end of the exemplary probe, an inner conductive finger 250 is connected to the inner conductor 126 of the cable 124 and a pair of outer conductive fingers 252a, 252b are conductively connected to the adjacent outer conductor 130 so as to form a signal-ground conductor configuration. While the exemplary probe tip includes a pair of outer conductive fingers, the probe tip can be constructed with a single outer finger. Referring also to FIG. 8, which shows a bottom view of the probing end 146, each respective finger includes a cantilevered portion 254 that extends past the forward end 256 of the cable 124. The cantilevered portions 254 are arranged in transversely spaced apart relationship to each other so as to cooperatively form a controlled impedance transmission line in order that a low-loss transition can be made between the respective conductors 130 and 126 of the cable 124 and the respective pads on the device-under-test.

To a certain extent, the spacing between the respective fingers 252a, 252b, and 250 is determined by the geometry of the device contact pads and the cable. For example, in relation to the distal ends of the respective fingers, the pitch or centerline-to-centerline spacing 270 between adjacent pairs of the fingers is selected in order to match the pitch 270 of the contact pads on the device-under-test. The distal ends of the pair of fingers may be set apart at a pitch of 6 mils in order to match the 6 mil pitch of 2 mil square contact pads on a device-under-test. (It is also customary for the pad-to-pad pitch to be set at other values such as 4, 5, 8 or 10 mils). On the other hand, proximate the back face 204 of the cable 124, the pitch between adjacent fingers is selected to correspond with the pitch between the exposed face of the inner conductor 126 and the adjacent exposed face of the outer conductor 130 of the cable 124.

Aside from the dimensions just mentioned, the principal criteria used in selecting the respective dimensions and relative spacing of the fingers 250, 252a,252b is the desired establishment of a low-loss transmission line between the respective conductors 126 and 130 of the cable and the respective pads on the DUT.

The distal end 272 of the central finger 250 comprises the signal contact tip 44 and the distal ends of the outer fingers 252a, 252b are connected to ground through the outer conductor 130 of the coaxial cable 124. The three fingers are attached to the cable near the end of the cable 124 by a non-conductive adhesive 276, such as an epoxy adhesive. At the end of the fingers remote from the contact tips, the center finger 250 is affixed to the center conductor 126 and the outer contact tips 252a,252b are affixed to the outer conductor 130 of the coaxial cable. Referring to FIG. 8, to incorporate an impedance matching resistor 52 in series between the center conductor 126 of the coaxial cable 124 and the signal contact tip 44, an aperture 280 is drilled in the body of the central finger 252 at a position between the soldered connection 278 and the non-conductive attachment 276 of the center finger to the cable. The aperture 280 is of such size and depth as to sever the center finger 250 and the center conductor 126 of the cable 124. A resistor 282 deposited on a ceramic substrate is inserted into the aperture and bonded in the aperture 280. A conductive adhesive 284 connects the forward portion of the center finger 250 to the rearward portion which is soldered to the center conductor 126.

As illustrated in FIG. 6, the coaxial cable 150 connected to the second input port 122 of the combined signal probe 100 follows a path through the probe substantially paralleling that of the coaxial cable 124 connected to the first input port 120. The coaxial cable 150 from the second input port 122 terminates adjacent to the probe end of the coaxial cable 124. A jumper 300 is affixed to the center conductor 302 of the coaxial cable 150 and to the center finger 250 projecting from the coaxial cable 124. As a result, DC current from the power supply 24 transmitted through the second input port 124 of the combined signal probe 100 is conducted directly to the signal contact tip 44 at the end 272 the center finger 250 over a signal path that does not pass through the impedance matching resistor 52.

Figure 10:
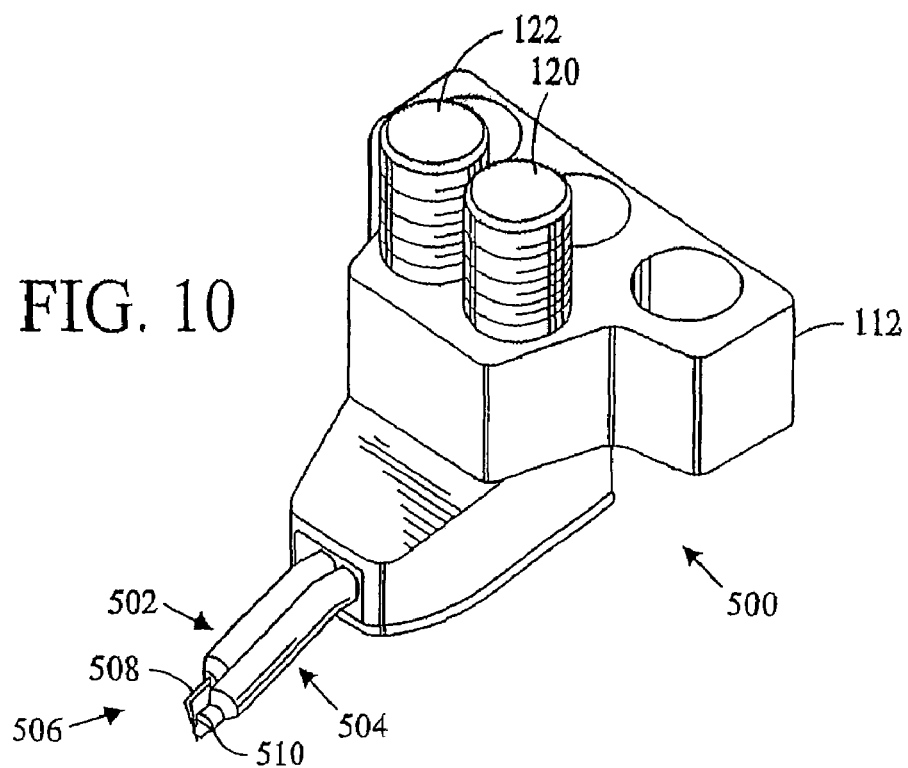
FIG. 10 is a perspective view of a second embodiment of a combined signal probe having separated direct current and modulation signal contact tips.
Figure 11:
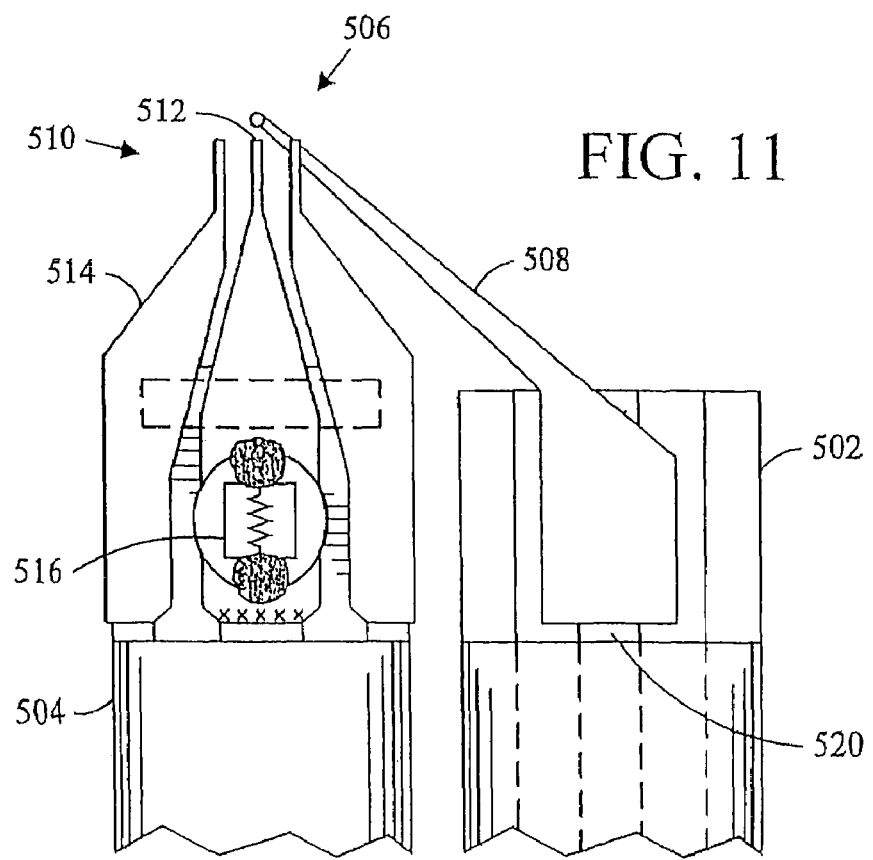
FIG. 11 is a bottom view of the probe tip of the probe of FIG. 10 having separated contact tips.

Referring to FIG. 10, a second embodiment of the combined signal probe 500 comprises, generally, the primary support block 112 for mounting the probe and the K-connectors of the input ports 120, 122 and supporting coaxial cables 502, 504 connecting the input ports and the probe's tip assembly 506. The tip assembly 506 comprises individual contact tip assemblies for each the direct current 508 and the modulation signal 510 signal paths. Referring to FIG. 11, the contact tip assembly for the modulation signal 510 comprises a modulation signal tip 512 and at least one ground contact tip 514 arranged to simultaneously engage the DUT's signal and ground contact pads, respectively. The impedance matching resistor 516 connects the modulation signal contact tip 512 to the modulation signal path at the center conductor of the coaxial cable 504. The direct current tip assembly 508 comprises a contact tip connected to the center conductor 520 of the coaxial cable 502 which provides the signal path for the direct current. The direct current contact tip 508 is arranged to contact the signal contact pad of the DUT when the modulation signal contact tip 510 and the ground signal contact tips 514 are brought into engagement with the signal and ground contact pads of the DUT. The direct current contact tip 508 may have a needle-like structure to provide an inductive element 82 that passes the direct current with minimal resistance but exhibits a high impedance to signals at the frequency of the modulation signal.

The combined signal probe, probe system, and the method of probing permits a DC current and a modulation signal to be transmitted in parallel for combination at the probe signal contact tip so that impedance matching can be applied to the modulation signal path to reduce signal distortion while resistance is minimized in the path of the DC signal to minimize voltage drop and power dissipation.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A method of testing a device-under-test, said method comprising the steps of:
   (a) engaging a contact pad of said device-under-test with a signal contact tip of a probe testing apparatus;
   (b) connecting a first port of an impedance matching member to said signal contact tip;
   (c) conducting a first signal to said signal contact tip;
   (d) conducting a second signal to a second port of said impedance matching member;
   (e) wherein said second signal has a higher frequency than said first signal.

2. The method of claim 1 wherein said first signal is a direct current.

3. The method of claim 2 wherein said second signal is an alternating signal.

4. The method of claim 3 further comprising the steps of:
   (a) blocking a flow of said direct current from said signal contact tip to a source of said alternating signal;
   (b) conducting said direct current from a source to said signal contact tip over a signal path including an inductor, said inductor having a minimal impedance to said direct current and an impedance substantially greater than said device-under-test at a modulation frequency of said alternating signal.

5. The method of claim 1 further comprising the steps of:
   (a) blocking a flow of said direct current from said signal contact tip to a source of said alternating signal;
   (b) separating a combined signal on said signal contact tip into a direct current component and a alternating signal component;
   (c) terminating a signal path of said alternating signal component.

6. The method of claim 1 further comprising the steps of:
   (a) generating a combined signal comprising a direct current component and an alternating signal component;
   (b) separating said direct current component of said combined signal from said alternating signal component;
   (c) terminating a signal path of said alternating signal component.

* * * * *